United States Patent
Watanabe et al.

(10) Patent No.: US 11,817,053 B2
(45) Date of Patent: Nov. 14, 2023

(54) DISPLAY DEVICE

(71) Applicant: SEMICONDUCTOR ENERGY LABORATORY CO., LTD., Atsugi (JP)

(72) Inventors: Kazunori Watanabe, Tokyo (JP); Susumu Kawashima, Kanagawa (JP); Koji Kusunoki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/730,583

(22) Filed: Apr. 27, 2022

(65) Prior Publication Data

US 2022/0254860 A1    Aug. 11, 2022

Related U.S. Application Data

(63) Continuation of application No. 17/003,655, filed on Aug. 26, 2020, now Pat. No. 11,355,577.

(30) Foreign Application Priority Data

Aug. 29, 2019 (JP) .................................. 2019-157094
May  8, 2020 (JP) .................................. 2020-082434

(51) Int. Cl.
   *G09G 3/3233* (2016.01)
   *G09G 3/3275* (2016.01)
   (Continued)

(52) U.S. Cl.
   CPC ......... *G09G 3/3233* (2013.01); *G09G 3/2003* (2013.01); *G09G 3/3275* (2013.01); *H10K 59/131* (2023.02); *G09G 2300/0452* (2013.01)

(58) Field of Classification Search
   CPC .. G09G 3/3233; G09G 3/3275; G09G 3/2003; G09G 2300/0452; G09G 2300/0426; H10K 59/131
   See application file for complete search history.

(56) References Cited

U.S. PATENT DOCUMENTS 6,175,351 B1    1/2001   Matsuura et al.
7,928,945 B2    4/2011   Kimura et al.
                        (Continued)

FOREIGN PATENT DOCUMENTS

CN    102654979 A    9/2012
JP    07-092935 A    4/1995
                (Continued)

*Primary Examiner* — Xuemei Zheng
(74) *Attorney, Agent, or Firm* — Fish & Richardson P.C.

(57) ABSTRACT

A display device that can easily achieve higher definition is provided The display device includes a pixel, a first wiring, and a second wiring. The pixel includes first to fourth transistors, a first capacitor, and a light-emitting element. One of a source and a drain of the first transistor is connected to the first wiring, and the other of the source and the drain of the first transistor is connected to a gate of the second transistor and to the first capacitor. The light-emitting element is connected to one of a source and a drain of the second transistor. The first wiring is supplied with a first data potential. The second wiring is supplied with a second data potential and a reset potential in different periods. The third transistor supplies the second data potential to the first capacitor. The fourth transistor supplies the reset potential to the light-emitting element.

12 Claims, 27 Drawing Sheets

(51) Int. Cl.
*G09G 3/20* (2006.01)
*H10K 59/131* (2023.01)

(56) References Cited

U.S. PATENT DOCUMENTS

| | | | |
|---|---|---|---|
| 8,564,629 B2 | 10/2013 | Toyotaka et al. | |
| 8,643,591 B2 | 2/2014 | Kimura et al. | |
| 8,830,278 B2 | 9/2014 | Koyama et al. | |
| 8,976,090 B2 | 3/2015 | Yamamoto et al. | |
| 11,189,643 B2 | 11/2021 | Kawashima et al. | |
| 11,204,533 B2 | 12/2021 | Kawashima et al. | |
| 11,355,082 B2 | 6/2022 | Kawashima et al. | |
| 11,513,405 B2 | 11/2022 | Kawashima et al. | |
| 11,543,711 B2 | 1/2023 | Kawashima et al. | |
| 2004/0263440 A1 | 12/2004 | Kimura et al. | |
| 2008/0198104 A1 | 8/2008 | Yamashita et al. | |
| 2011/0186852 A1 | 8/2011 | Kimura et al. | |
| 2012/0223978 A1 | 9/2012 | Yamamoto et al. | |
| 2013/0299789 A1 | 11/2013 | Yamazaki et al. | |
| 2014/0291640 A1* | 10/2014 | Miyake | H10K 59/1213 257/40 |
| 2016/0093641 A1* | 3/2016 | Takahashi | G09G 3/3233 257/43 |
| 2016/0171930 A1 | 6/2016 | Song et al. | |
| 2017/0032728 A1* | 2/2017 | Shima | G06F 3/0412 |
| 2017/0170200 A1* | 6/2017 | Ikeda | H01L 27/124 |
| 2017/0256207 A1* | 9/2017 | Takahashi | G09G 3/3233 |
| 2019/0006452 A1 | 1/2019 | Cho et al. | |
| 2020/0142229 A1 | 5/2020 | Kusunoki et al. | |
| 2020/0175905 A1* | 6/2020 | Yamazaki | G06N 3/0454 |
| 2020/0193928 A1 | 6/2020 | Kawashima et al. | |
| 2020/0194527 A1 | 6/2020 | Kawashima et al. | |
| 2020/0258921 A1* | 8/2020 | Takahashi | H01L 27/1259 |
| 2020/0279525 A1* | 9/2020 | Kawashima | H01L 27/3265 |
| 2020/0302889 A1 | 9/2020 | Takahashi et al. | |
| 2022/0253517 A1 | 8/2022 | Yamazaki et al. | |

FOREIGN PATENT DOCUMENTS

| | | |
|---|---|---|
| JP | 11-084419 A | 3/1999 |
| JP | 2000-259130 A | 9/2000 |
| JP | 2003-216109 A | 7/2003 |
| JP | 2004-341314 A | 12/2004 |
| JP | 2009-156961 A | 7/2009 |
| JP | 2012-003236 A | 1/2012 |
| JP | 2012-141569 A | 7/2012 |
| JP | 2012-185328 A | 9/2012 |
| JP | 2013-003223 A | 1/2013 |
| JP | 2014-197522 A | 10/2014 |

\* cited by examiner

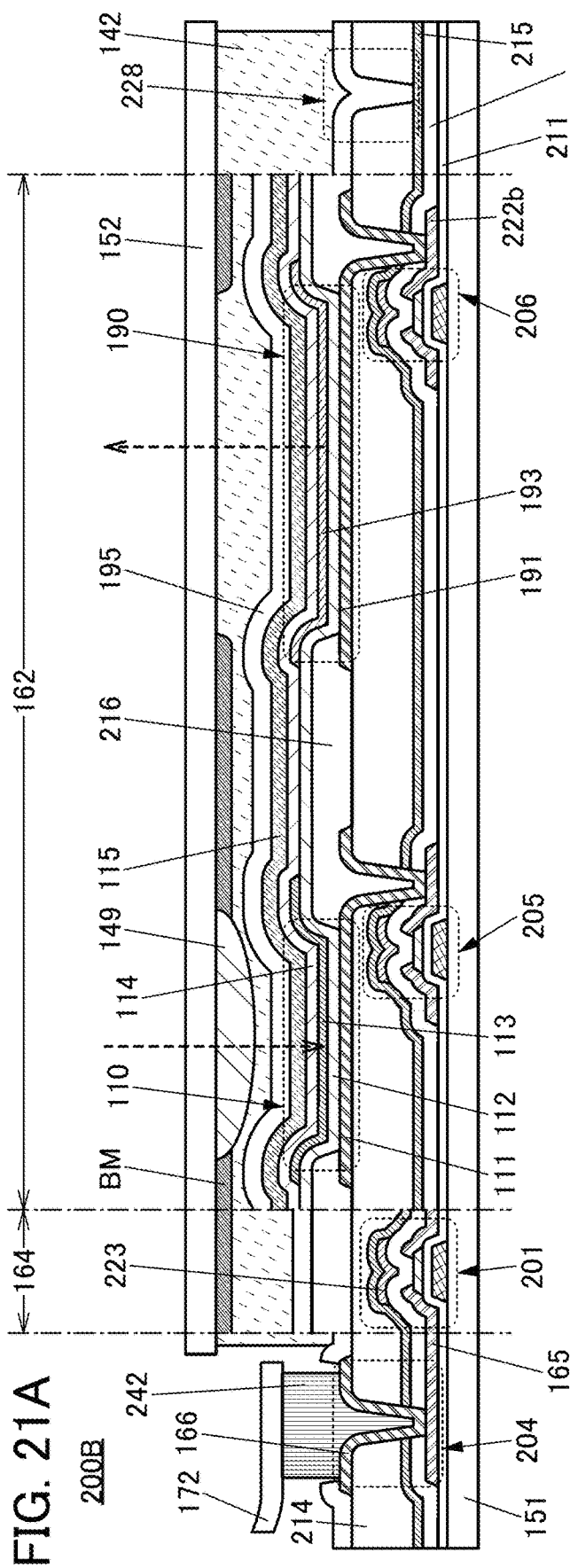

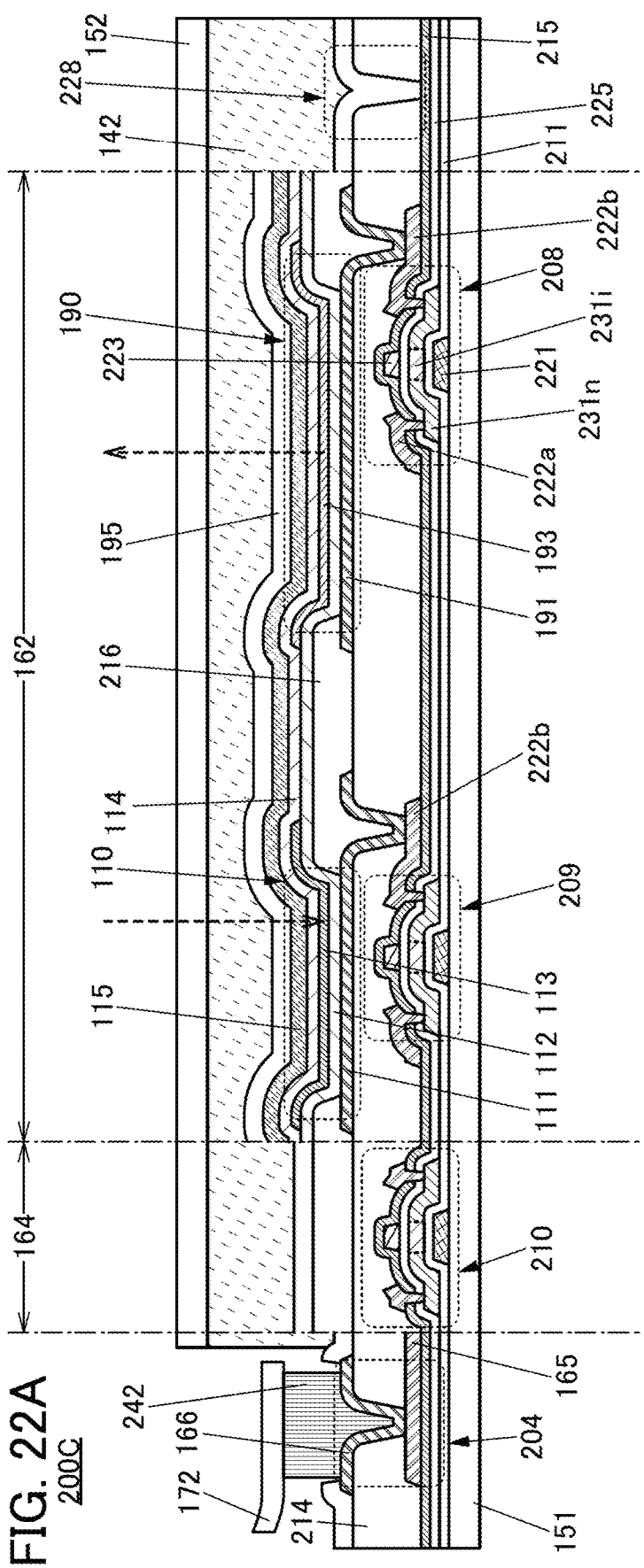
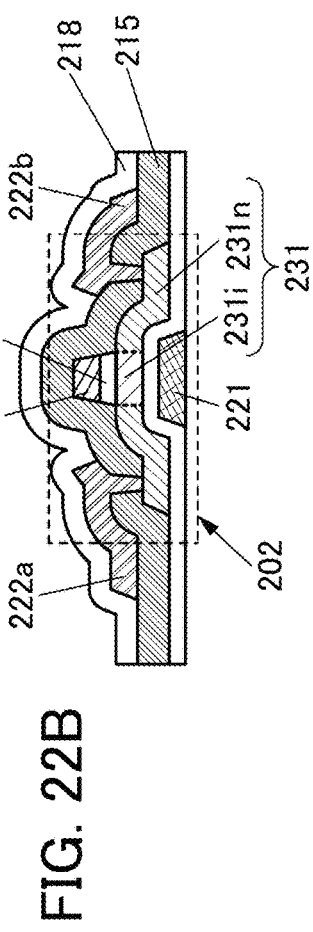
FIG. 22A
200C
FIG. 22B

P

Q

DISPLAY DEVICE

CROSS-REFERENCE TO RELATED APPLICATIONS

This application is a continuation of U.S. application Ser. No. 17/003,655, filed Aug. 26, 2020, now allowed, which claims the benefit of foreign priority applications filed in Japan as Serial No. 2020-082434 on May 8, 2020, and Serial No. 2019-157094 on Aug. 29, 2019, all of which are incorporated by reference.

BACKGROUND OF THE INVENTION

1. Field of the Invention

One embodiment of the present invention relates to a display device. One embodiment of the present invention relates to a display device with an imaging function.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device refers to a device that can function by utilizing semiconductor characteristics in general.

2. Description of the Related Art

In recent years, display devices have been required to have higher definition in order to display high-resolution images. In addition, display devices used in information terminals such as smartphones, tablet terminals, and laptop personal computers (PCs) have been required to have higher definition and lower power consumption. Furthermore, display devices have been required to have a variety of functions such as a touch panel function and a function of capturing images of fingerprints for authentication in addition to a function of displaying images.

Light-emitting devices including light-emitting elements have been developed as display devices. Light-emitting elements utilizing electroluminescence (hereinafter referred to as EL elements) have features such as ease of reduction in thickness and weight, high-speed response to input signals, and capability of DC low voltage driving, and have been used in display devices. Patent Document 1, for example, discloses a flexible light-emitting device in which an organic EL element is used.

REFERENCE

Patent Document

Patent Document 1: Japanese Published Patent Application No. 2014-197522

SUMMARY OF THE INVENTION

One object of one embodiment of the present invention is to provide a display device that can easily achieve higher definition. Another object of one embodiment of the present invention is to provide a display device whose power consumption can be reduced. Another object of one embodiment of the present invention is to provide a display device that can function as a touch panel. Another object of one embodiment of the present invention is to provide a display device with an imaging function.

Note that the description of these objects does not disturb the existence of other objects. One embodiment of the present invention does not need to achieve all the objects. Objects other than these can be derived from the description of the specification, the drawings, the claims, and the like.

One embodiment of the present invention is a display device including a pixel, a first wiring, and a second wiring. The pixel includes first to fourth transistors, a first capacitor, and a light-emitting element. One of a source and a drain of the first transistor is electrically connected to the first wiring, and the other of the source and the drain of the first transistor is electrically connected to a gate of the second transistor and one electrode of the first capacitor. One electrode of the light-emitting element is electrically connected to one of a source and a drain of the second transistor. The first wiring has a function of being supplied with a first data potential. The second wiring has a function of being supplied with a second data potential and a reset potential in different periods. The third transistor has a function of supplying the second data potential supplied to the second wiring to the other electrode of the first capacitor when the third transistor is in an on state. The fourth transistor has a function of supplying the reset potential supplied to the second wiring to the one electrode of the light-emitting element when the fourth transistor is in an on state.

Another embodiment of the present invention is a display device including a pixel, a first wiring, and a second wiring. The pixel includes first to fourth transistors, a first capacitor, and a light-emitting element. One of a source and a drain of the first transistor is electrically connected to the first wiring, and the other of the source and the drain of the first transistor is electrically connected to a gate of the second transistor and one electrode of the first capacitor. One electrode of the light-emitting element is electrically connected to one of a source and a drain of the second transistor. The first wiring has a function of being supplied with a first data potential. The second wiring has a function of being supplied with a second data potential and a reset potential in different periods. One of a source and a drain of the third transistor is electrically connected to the second wiring, and the other of the source and the drain of the third transistor is electrically connected to the other electrode of the first capacitor. One of a source and a drain of the fourth transistor is electrically connected to the second wiring, and the other of the source and the drain of the fourth transistor is electrically connected to the one electrode of the light-emitting element.

Another embodiment of the present invention is a display device including a pixel, a first wiring, and a second wiring. The pixel includes first to fourth transistors, a first capacitor, and a light-emitting element. One of a source and a drain of the first transistor is electrically connected to the first wiring, and the other of the source and the drain of the first transistor is electrically connected to a gate of the second transistor and one electrode of the first capacitor. One electrode of the light-emitting element is electrically connected to one of a source and a drain of the second transistor. The first wiring has a function of being supplied with a first data potential. The second wiring has a function of being supplied with a second data potential and a reset potential in different periods. One of a source and a drain of the third transistor is electrically connected to the second wiring, and the other of the source and the drain of the third transistor is electrically connected to the other electrode of the first capacitor and one of a source and a drain of the fourth transistor. The other of the source and the drain of the fourth transistor is electrically connected to the one electrode of the light-emitting element.

In the above, a third wiring and a fourth wiring are preferably included. The third wiring is electrically connected to a gate of the first transistor and a gate of the fourth transistor. The fourth wiring is electrically connected to a gate of the third transistor.

In the above, a second capacitor is preferably further included. One electrode of the second capacitor is electrically connected to the gate of the second transistor, and the other electrode of the second capacitor is electrically connected to the one electrode of the light-emitting element.

In the above, a plurality of pixels are preferably included. In that case, the plurality of pixels are arranged in a matrix in a row direction and a column direction. The second wiring is preferably electrically connected to the third transistor and the fourth transistor in each of two or more pixels among the plurality of pixels arranged in the row direction.

Alternatively, the second wiring is preferably electrically connected to the third transistor and the fourth transistor in each of three adjacent pixels among the plurality of pixels arranged in the row direction. In that case, the three adjacent pixels preferably emit light of different colors.

In the above, a light-receiving element is preferably further included. In that case, the light-receiving element has a function of receiving light emitted from the light-emitting element. In addition, the light-emitting element and the light-receiving element are preferably provided on the same plane.

In the above, in the light-emitting element, a first electrode, a light-emitting layer, and a common electrode are preferably stacked. In the light-receiving element, a second electrode, an active layer, and the common electrode are preferably stacked. In that case, it is preferable that the light-emitting layer and the active layer contain different organic compounds, the first electrode and the second electrode be provided on the same plane to be apart from each other, and the common electrode be provided to cover the light-emitting layer and the active layer.

In the above, in the light-emitting element, a first electrode, a common layer, a light-emitting layer, and a common electrode are preferably stacked. In the light-receiving element, a second electrode, the common layer, an active layer, and the common layer are preferably stacked. In that case, it is preferable that the light-emitting layer and the active layer contain different organic compounds, the first electrode and the second electrode be provided on the same plane to be apart from each other, the common electrode be provided to cover the light-emitting layer and the active layer, and the common layer be provided to cover the first electrode and the second electrode.

One embodiment of the present invention can provide a display device that can easily achieve higher definition. Alternatively, one embodiment of the present invention can provide a display device whose power consumption can be reduced.

Alternatively, one embodiment of the present invention can provide a display device that can function as a touch panel. Alternatively, one embodiment of the present invention can provide a display device with an imaging function.

Note that the description of the effects does not disturb the existence of other effects. One embodiment of the present invention does not need to have all the effects. Effects other than these can be derived from the description of the specification, the drawings, the claims, and the like.

BRIEF DESCRIPTION OF THE DRAWINGS

In the accompanying drawings:

FIGS. 21A and 21B each show a structure example of a display device;

FIGS. 22A and 22B each show a structure example of a display device;

DETAILED DESCRIPTION OF THE INVENTION

Figure 1A:
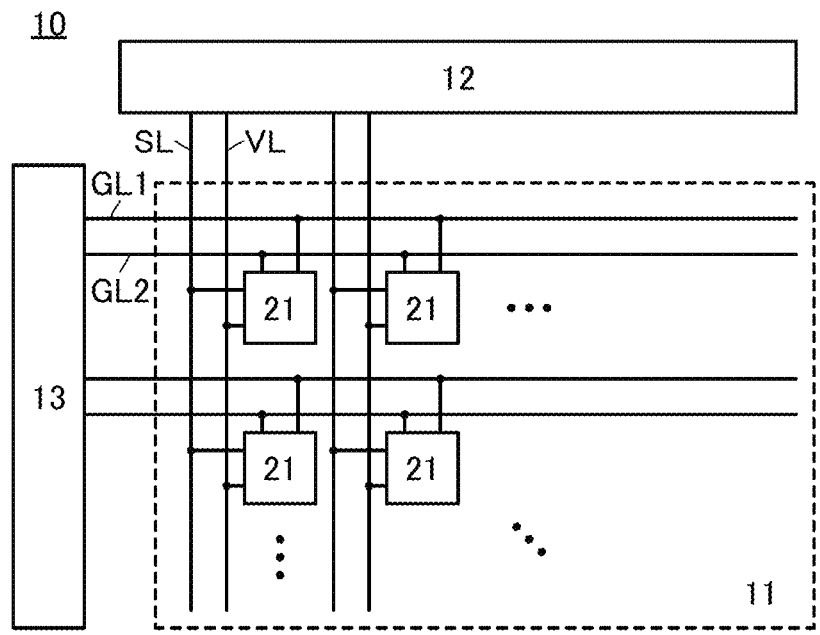
FIG. 1A is a block diagram of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. Moreover, similar functions are denoted by the same hatch pattern and are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

A transistor is a kind of semiconductor elements and can achieve amplification of current or voltage, switching operation for controlling conduction or non-conduction, or the like. A transistor in this specification includes, in its category, an insulated-gate field effect transistor (IGFET) and a thin film transistor (TFT).

Furthermore, functions of a source and a drain might be interchanged with each other when a transistor of opposite polarity is employed or when the direction of current is changed in circuit operation, for example. Therefore, the terms "source" and "drain" can be interchanged with each other in this specification.

Note that in this specification, an EL layer means a layer containing at least a light-emitting substance (also referred to as a light-emitting layer) or a stack including the light-emitting layer provided between a pair of electrodes of a light-emitting element.

In this specification and the like, a display panel that is one embodiment of a display device has a function of displaying (outputting) an image or the like on (to) a display surface. Thus, the display panel is one embodiment of an output device.

Furthermore, in this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Therefore, the touch panel is one embodiment of an input/output device.

A touch panel can also be referred to as, for example, a display panel (or a display device) with a touch sensor or a display panel (or a display device) having a touch sensor function. A touch panel can include a display panel and a touch sensor panel. Alternatively, a touch panel can have a function of a touch sensor inside a display panel or on a surface thereof.

Furthermore, in this specification and the like, a substrate of a touch panel to which a connector or an IC is attached is referred to as a touch panel module, a display module, or simply a touch panel or the like in some cases.

Embodiment 1

In this embodiment, structure examples and driving method examples of a display device according to one embodiment of the present invention will be described.

One embodiment of the present invention is a display device that includes a plurality of pixels arranged in a matrix. The pixel includes first to fourth transistors, a capacitor, and a light-emitting element. The display device further includes a first wiring and a second wiring that are electrically connected to the pixels.

The second transistor has a function of controlling current flowing through the light-emitting element and functions as a driving transistor. The first transistor functions as a switch for controlling the conduction and non-conduction between the first wiring and a gate of the second transistor. The first wiring is supplied with a first data potential, and the first data potential can be applied to the gate of the second transistor through the first transistor when the first transistor is turned on (is brought into conduction).

The second wiring is supplied with a second data potential and a reset potential in different periods.

One electrode (also referred to as a first electrode) of the capacitor is electrically connected to the gate of the second transistor. The third transistor functions as a switch for controlling the conduction and non-conduction between the other electrode (also referred to as a second electrode) of the capacitor and the second wiring. The second data potential can be applied to the second electrode of the capacitor through the third transistor when the third transistor is turned on.

After the first data potential is applied to the gate of the second transistor, the first transistor is turned off (is brought out of conduction) to bring the gate of the second transistor into a floating state, and the second data potential is applied to the second electrode of the capacitor through the third transistor. Accordingly, a potential of the gate of the second transistor can be changed from the first data potential depending on the second data potential by capacitive coupling through the capacitor.

In this manner, the pixel can generate a potential to be supplied to a gate of the driving transistor (the second transistor) of the light-emitting element by a combination of two kinds of data potentials. For example, gradation correction can be performed with the second data potential. In addition, the pixel in the display device can generate a potential higher than the maximum potential that can be supplied from a driver circuit (a source driver circuit) for supplying the first data potential and the second data potential. Accordingly, the power supply voltage of the driver circuit can be lowered, and the power consumption of the driver circuit can be reduced.

The fourth transistor functions as a switch for supplying the reset potential to be supplied to the second wiring to the one electrode (the first electrode) of the light-emitting element. When the reset potential is applied to the second wiring, the fourth transistor is turned on, so that the reset potential is applied to the first electrode of the light-emitting element. When the first data potential and the reset potential are supplied in the same period, the gate-source voltage of the second transistor can be determined regardless of electrical characteristics of the light-emitting element. Thus, high-quality display can be achieved.

In the display device according to one embodiment of the present invention, the second wiring can function as a wiring for supplying the second data potential and a wiring for supplying the reset potential. Accordingly, even in a multifunctional display device, the number of wirings can be reduced, so that higher definition can be achieved.

In addition, the second wiring may be a wiring for supplying the second data potential and the reset potential to two or more pixels. This is preferable because the number of wirings included in the display device can be further reduced.

Here, the third transistor may be provided between the second wiring and the fourth transistor, and the reset potential may be supplied from the second wiring to the first electrode of the light-emitting element when each of the third transistor and the fourth transistor is in an on state. Accordingly, the number of wirings provided in the pixel can be reduced, so that higher definition can be achieved more easily.

Alternatively, a structure may be employed in which the second wiring and one of a source and a drain of the fourth transistor are electrically connected to each other and the third transistor is not provided between the second wiring and the one of the source and the drain of the fourth transistor. Accordingly, a difference between the reset potential applied to the second wiring and a potential applied to the first electrode of the light-emitting element can be made smaller than that in the case where the reset potential is supplied through two transistors.

More specific examples are described below with reference to drawings.

STRUCTURE EXAMPLE 1

FIG. 1A is a block diagram of a display device 10. The display device 10 includes a display portion 11, a driver circuit portion 12, and a driver circuit portion 13.

In the display portion 11, a plurality of pixels 21 are arranged in a matrix. The pixel 21 is electrically connected to wirings SL, VL, GL1, and GL2. The wirings SL and VL are electrically connected to the driver circuit portion 12. The wirings GL1 and GL2 are electrically connected to the driver circuit portion 13. The driver circuit portion 12 functions as a source line driver circuit (also referred to as a source driver). The driver circuit portion 13 functions as a gate line driver circuit (also referred to as a gate driver).

PIXEL CONFIGURATION EXAMPLE 1-1

Figure 1B:
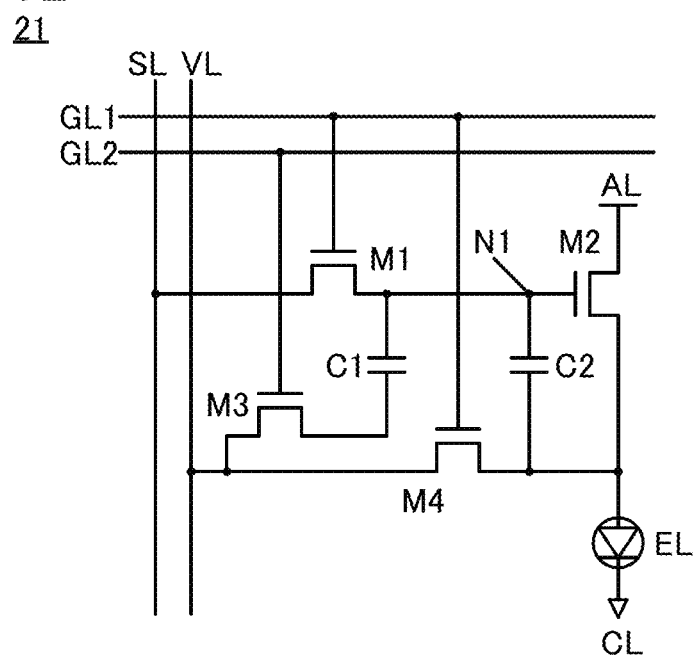
FIG. 1B is a pixel circuit diagram.

FIG. 1B shows an example of a circuit diagram of the pixel 21. The pixel 21 includes a transistor M1, a transistor M2, a transistor M3, a transistor M4, a capacitor C1, a capacitor C2, and a light-emitting element EL.

A gate of the transistor M1 is electrically connected to the wiring GL1. One of a source and a drain of the transistor M1 is electrically connected to the wiring SL. The other of the source and the drain of the transistor M1 is electrically connected to one electrode (a first electrode) of the capacitor C1, one electrode (a first electrode) of the capacitor C2, and a gate of the transistor M2. One of a source and a drain of the transistor M2 is electrically connected to a wiring AL. The other of the source and the drain of the transistor M2 is electrically connected to one electrode (an anode electrode or a first electrode) of the light-emitting element EL. A gate of the transistor M3 is electrically connected to the wiring GL2. One of a source and a drain of the transistor M3 is electrically connected to the wiring VL. The other of the source and the drain of the transistor M3 is electrically connected to the other electrode (a second electrode) of the capacitor C1. A gate of the transistor M4 is electrically connected to the wiring GL1. One of a source and a drain of the transistor M4 is electrically connected to the wiring VL. The other of the source and the drain of the transistor M4 is electrically connected to the one electrode of the light-emitting element EL, the other electrode (a second electrode) of the capacitor C2, and the one of the source and the drain of the transistor M3. The other electrode (a cathode electrode or a second electrode) of the light-emitting element EL is electrically connected to a wiring CL.

The transistors M1, M3, and M4 function as switches. The transistor M2 functions as a transistor for controlling current flowing through the light-emitting element EL.

A data potential D (also referred to as a first data potential) is applied to the wiring SL. A data potential $D_W$ (also referred to as a second potential potential) and a reset potential $V_R$ are applied to the wiring VL in different periods. Different selection signals are supplied to the wirings GL1 and GL2. The selection signals include a potential for turning on a transistor and a potential for turning off the transistor.

The wiring AL is a wiring to which an anode potential is applied. The wiring CL is a wiring to which a cathode potential is applied. In the pixel 21, the anode potential is higher than the cathode potential.

Here, as shown in FIG. 1B, a node to which the gate of the transistor M2 is connected is referred to as a node N1.

Note that in this specification and the like, a node is an element (e.g., a wiring) that enables electrical connection between elements included in a circuit. Thus, a "node to which A is connected" is a wiring that is electrically connected to A and can be regarded as having the same potential as A. Note that even when one or more elements that enable electrical connection (e.g., switches, transistors, capacitors, inductors, resistors, or diodes) are inserted in a portion of the wiring, the wiring can be regarded as the "node to which A is connected" as long as it can be regarded as having the same potential as A.

Here, a transistor with extremely low off-state leakage current is preferably used as each of the transistors M1, M3, and M4 functioning as switches. In particular, a transistor including an oxide semiconductor in a semiconductor layer where a channel is formed can be favorably used. It is preferable to use a transistor including an oxide semiconductor as the transistor M2 because all the transistors can be formed through the same manufacturing steps. Note that the transistor M2 may be formed using silicon (including amorphous silicon, polycrystalline silicon, or single crystal silicon) in a semiconductor layer where a channel is formed. Alternatively, all the transistors can be formed using silicon.

Driving Method Example 1

Figure 2:
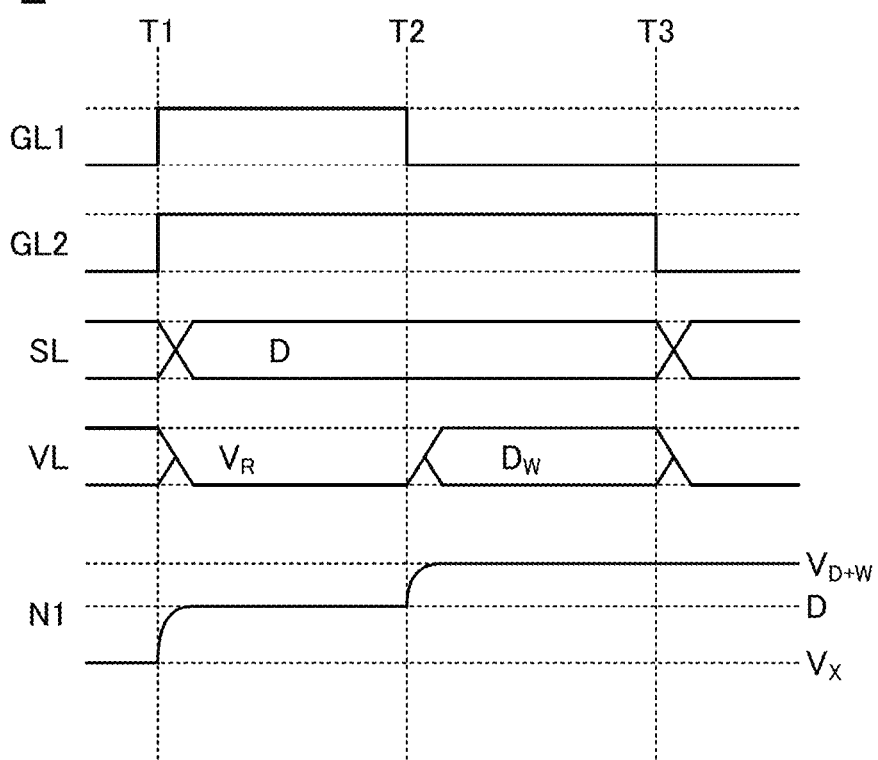
FIG. 2 is a timing chart illustrating a method for driving the display device.

An example of a method for driving the pixel 21 shown in FIG. 1B is described with reference to a timing chart in FIG. 2. FIG. 2 shows signals input to the wirings GL1, GL2, SL, and VL and an example of a change in the potential of the node N1.

Note that in the following description, the influence of the threshold voltage of the transistor, the on-state resistance of the transistor, the gate capacitance of the transistor, wiring resistance, parasitic capacitance, and the like is not considered for simplification of the description.

<Before Time T1>

Before Time T1, a potential for turning off the transistor (here, a low-level potential) is applied to the wirings GL1 and GL2. Data to be written to pixels in the previous row is supplied to the wirings SL and VL. As the potential of the node N1, a potential Vx that is written in the previous frame is applied.

<Period T1-T2>

At Time T1, a potential for turning on the transistor (here, a high-level potential) is applied to the wirings GL1 and GL2, the data potential D is applied to the wiring SL, and the reset potential $V_R$ is applied to the wiring VL.

In the period T1-T2, the transistors M1, M3, and M4 are turned on. The reset potential $V_R$ is supplied to the first electrode of the light-emitting element EL and the second electrode of the capacitor C2 through the transistor M4. The reset potential $V_R$ is supplied to the second electrode of the capacitor C1 through the transistor M3. The data potential D is supplied to the node N1 through the transistor M1.

As described above, when the data potential D is written to the node N1, the reset potential $V_R$ is written to a node to which the anode electrode of the light-emitting element EL is connected, so that a potential difference between this node and the node N1, that is, gate-source voltage of the transistor M2 can be determined regardless of the electrical state of the light-emitting element EL. Specifically, the gate-source voltage of the transistor M2 is D-$V_R$ with the reset potential $V_R$ used as a reference.

In addition, charge is stored in the capacitor C1 depending on a potential difference between the data potential D and the reset potential $V_R$.

Note that at this time, the reset potential $V_R$ is applied to the anode electrode of the light-emitting element EL. When the reset potential $V_R$ is set so that voltage between the pair of electrodes of the light-emitting element EL does not exceed the threshold voltage of the light-emitting element EL, light is not emitted from the light-emitting element EL.
<Period T2-T3>

Then, at Time T2, a low-level potential is applied to the wiring GL1, a high-level potential is applied to the wiring GL2, and the data potential $D_W$ is applied to the wiring VL.

When the wiring GL1 has a low-level potential, the transistors M1 and M4 are turned off. Accordingly, the node N1 is brought into a floating state.

The data potential $D_W$ is applied to the second electrode of the capacitor C1 through the transistor M3. Since the voltage D-$V_R$ is stored in the capacitor C1, the potential of the node N1 changes from the data potential D into a potential $V_{D+W}$ by capacitive coupling when the potential of the second electrode of the capacitor C1 changes from the reset potential $V_R$ into the data potential $D_W$. Here, the amount of change in the potential of the node N1 (i.e., a difference between the potential $V_{D+W}$ and the data potential D) is substantially determined by the capacitance of the capacitor C1 and the capacitance of the capacitor C2. In the case where the capacitance of the capacitor C1 is much larger than the capacitance of the capacitor C2, the amount of change in the potential of the node N1 is closer to a difference between the data potential $D_W$ and the reset potential $V_R$.

Thus, the potential $V_{D+W}$ is applied to the gate of the transistor M2. When current corresponding to the potential flows to the light-emitting element EL through the transistor M2, the light-emitting element EL can emit light.

For example, by applying a high-level potential as the data potential $D_W$, the emission luminance of the light-emitting element EL can be increased. In contrast, by applying a low-level potential as the data potential $D_W$, the emission luminance of the light-emitting element EL can be decreased.

With such a driving method, emission luminance can be adjusted for each of the pixels 21, so that what is called pixel dimming can be achieved. Luminance is optimally corrected in accordance with an image to be displayed, so that high-quality display can be achieved. In addition, in a conventional display device, video data needs to be generated by addition of data for display and data for correction and needs to be supplied to pixels. In contrast, in one embodiment of the present invention, data for display and data for correction can be independently supplied, so that a configuration of a driver circuit or the like can be simplified.
<At and After Time T3>

At Time T3, a low-level potential is applied to the wiring GL2. Thus, operation of writing data to the pixels 21 is completed. After Time T3, writing operation for the next row is performed.

The above is the description of the example of the method for driving the pixel 21.

Modification Example 1

Figure 3:
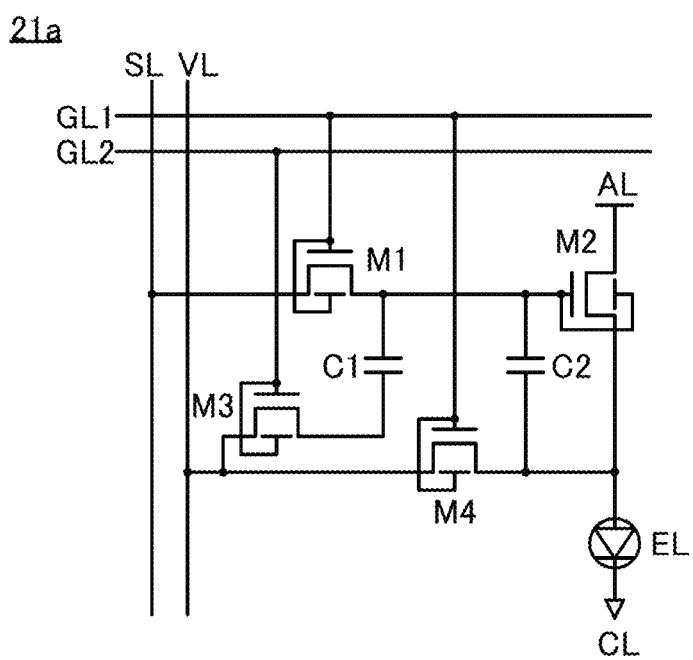
FIG. 3 is a pixel circuit diagram.

FIG. 3 is a circuit diagram of a pixel 21a that is a modification example of the pixel 21 shown in FIG. 1B.

In an example of the pixel 21a, the transistors M1 to M4 each include a back gate. A pair of gates of each transistor is electrically connected to each other. Thus, the on-state current of the transistor can be increased and saturation characteristics can be improved, so that a display device that has higher reliability can be achieved.

Note that although the pair of gates of each transistor is electrically connected to each other here, one embodiment of the present invention is not limited thereto. The pixel 21a may include a transistor in which one of gates is connected to another wiring. For example, when one of a pair of gates of a transistor is connected to a wiring to which a fixed potential is applied, the stability of electrical characteristics can be improved. Alternatively, one of a pair of gates of a transistor may be connected to a wiring to which a potential for controlling the threshold voltage of the transistor is applied.

Although the example in which the four transistors each include a back gate is shown here, a transistor that includes a back gate and a transistor that does not include a back gate may be used in combination.

Pixel Configuration Example 1-2

A configuration example of a pixel that is partly different from the configuration of the pixel shown in FIG. 1B is described below.

Figure 4A:
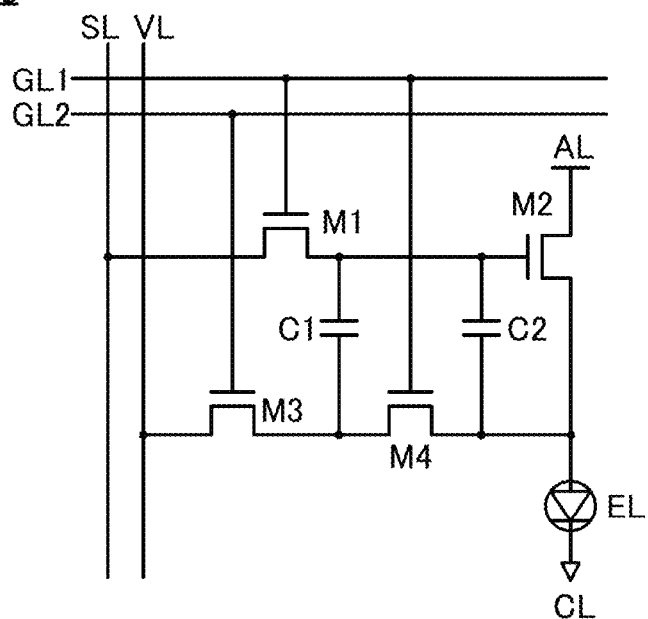
FIGS. 4A and 4B are pixel circuit diagrams.

FIG. 4A shows a circuit diagram of the pixel 21b. The pixel 21b differs from the pixel 21 mainly in connection between the capacitor C1 and the transistors M3 and M4.

The gate of the transistor M3 is electrically connected to the wiring GL2. The one of the source and the drain of the transistor M3 is electrically connected to the wiring VL. The other of the source and the drain of the transistor M3 is electrically connected to the second electrode of the capacitor C1 and the one of the source and the drain of the transistor M4. For other connection relationships, the description of the pixel 21 in FIG. 1B can be referred to.

In the pixel 21b, the second electrode of the capacitor C1, the other of the source and the drain of the transistor M3, and the one of the source and the drain of the transistor M4 are electrically connected to each other. This structure can simplify wirings in the pixel 21b and thus is suitable for higher definition.

The pixel 21b includes two transistors (the transistors M3 and M4) between the wiring VL and the anode electrode of the light-emitting element EL.

Modification Example 2

Figure 4B:
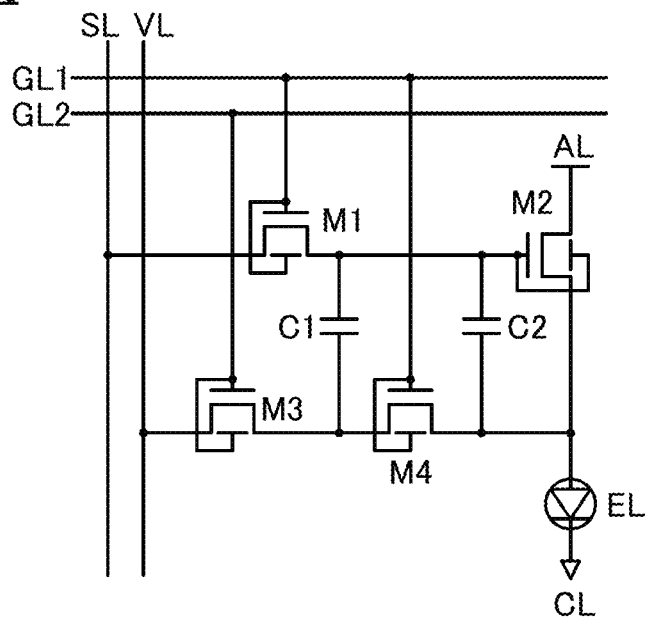

FIG. 4B is a circuit diagram of a pixel 21c that is a modification example of the pixel 21b shown in FIG. 4A.

In an example of the pixel 21c, the transistors M1 to M4 each include a back gate. As in the pixel 21a (see FIG. 3), a pair of gates of each transistor is electrically connected to each other.

Note that as in the pixel 21a, not all the transistors necessarily have a structure where the pair of gates is electrically connected to each other, and a transistor that is connected to another wiring may be included. In addition, not all the transistors necessarily include back gates, and a transistor that includes a back gate and a transistor that does not include a back gate may be used in combination.

Driving method example 1 can be referred to for examples of methods for driving the pixels 21b and 21c.

The above is the description of Structure example 1.

Structure Example 2

A structure example of a display device that is partly different from Structure example 1 is described below. Note that portions similar to those described above are not described below in some cases.

Figure 5:
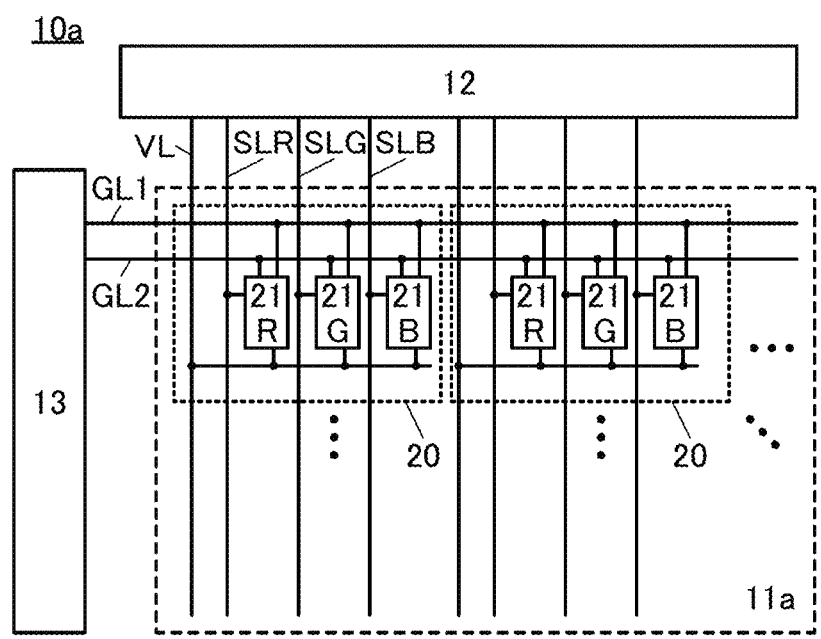
FIG. 5 is a block diagram of a display device.

FIG. 5 is a block diagram of a display device 10a. The display device 10a includes a display portion 11a, the driver circuit portion 12, and the driver circuit portion 13. The display portion 11a includes a plurality of pixels 20 arranged in a matrix.

The pixels 20 each include a subpixel 21R, a subpixel 21G, and a subpixel 21B. For example, the subpixel 21R exhibits a red color, the subpixel 21G exhibits a green color, and the subpixel 21B exhibits a blue color. Thus, the display device 10a can perform full-color display. Note that although the example where the pixels 20 each include subpixels of three colors is shown here, subpixels of four or more colors may be included.

The wirings GL1 and GL2 are electrically connected to the subpixels 21R, 21G, and 21B arranged in a row direction (an extending direction of the wiring GL1 or the like). Wirings SLR, SLG, and SLB are electrically connected to the subpixels 21R, 21G, and 21B arranged in a column direction (an extending direction of the wiring VL or the like), respectively. The wiring VL is electrically connected to the pixels 20 arranged in the column direction. The wiring VL is also electrically connected to the subpixels 21R, 21G, and 21B included in the pixel 20.

Pixel Configuration Example 2-1

Figure 6:
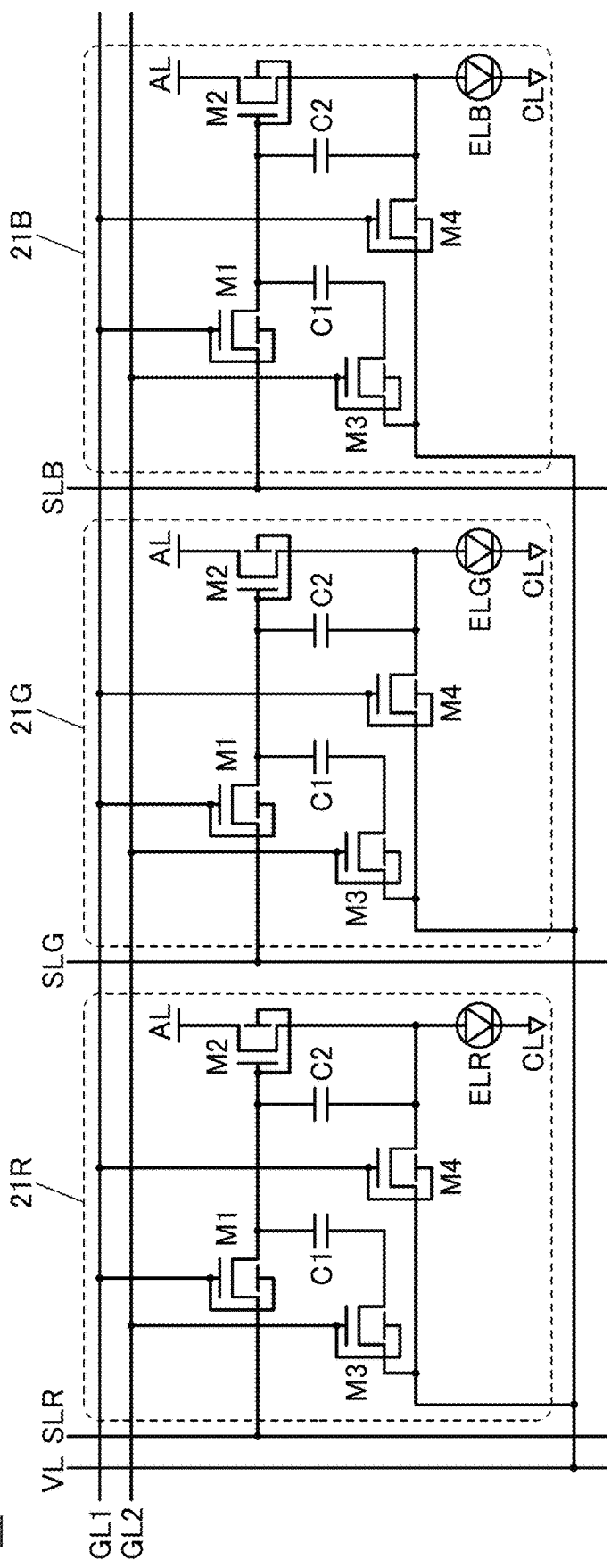
FIG. 6 is a pixel circuit diagram.

FIG. 6 shows an example of a circuit diagram of the pixel 20. The pixels 20 each include the subpixels 21R, 21G, and 21B.

The pixel 20 shown in FIG. 6 is an example in which the configuration of the pixel 21a shown in FIG. 3 is used for each of the subpixels 21R, 21G, and 21B. Note that each of the transistors included in the subpixels does not necessarily include a back gate. Alternatively, the configuration of the pixel 21 shown in FIG. 1B may be used for each of the subpixels 21R, 21G, and 21B.

The subpixel 21R includes a light-emitting element ELR emitting red light. The subpixel 21G includes a light-emitting element ELG emitting green light. The subpixel 21B includes a light-emitting element ELB emitting blue light. Note that the pixel 20 may include a subpixel including a light-emitting element emitting light of another color. For example, the pixel 20 may include, in addition to the three subpixels, a subpixel including a light-emitting element emitting white light or a subpixel including a light-emitting element emitting yellow light.

The wiring VL is electrically connected to the one of the source and the drain of each of the transistors M3 included in the subpixels 21R, 21G, and 21B. With such a structure, the number of wirings VL can be reduced to one-third of the number of wirings VL in the structure described in Structure example 1, so that a display device with higher definition can be achieved.

Pixel Configuration Example 2-2

Figure 7:
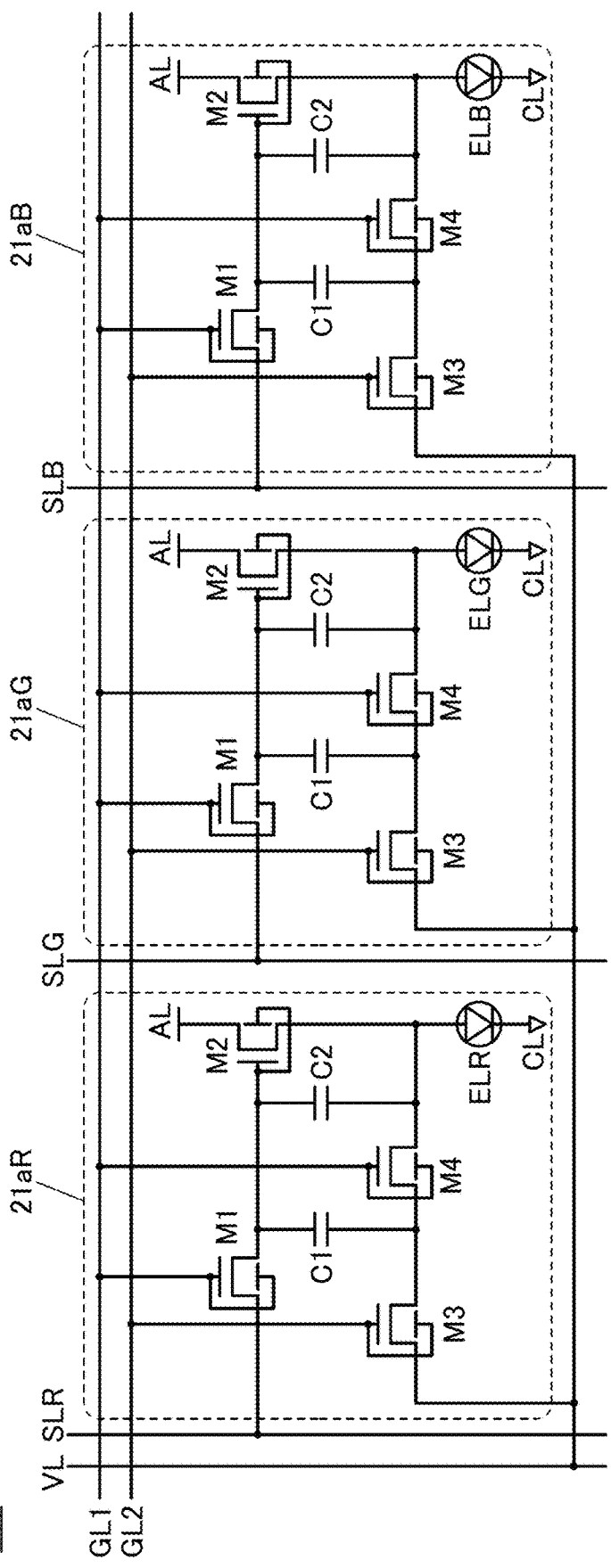
FIG. 7 is a pixel circuit diagram.

FIG. 7 shows an example of a circuit diagram of a pixel 20a. The pixel 20a includes a subpixel 21aR, a subpixel 21aG, and a subpixel 21aB.

The pixel 20a shown in FIG. 7 is an example in which the configuration of the pixel 21c shown in FIG. 4B is used for each of the subpixels 21aR, 21aG, and 21aB. Note that each of the transistors included in the subpixels does not necessarily include a back gate. Alternatively, the configuration of the pixel 21b shown in FIG. 4A may be used for each of the subpixels 21aR, 21aG, and 21aB.

Like the pixel 20, the pixel 20a shown in FIG. 7 can have a reduced number of wirings VL and thus can be regarded as being suitable for higher definition.

Driving Method Example 2-1

Figure 8A:
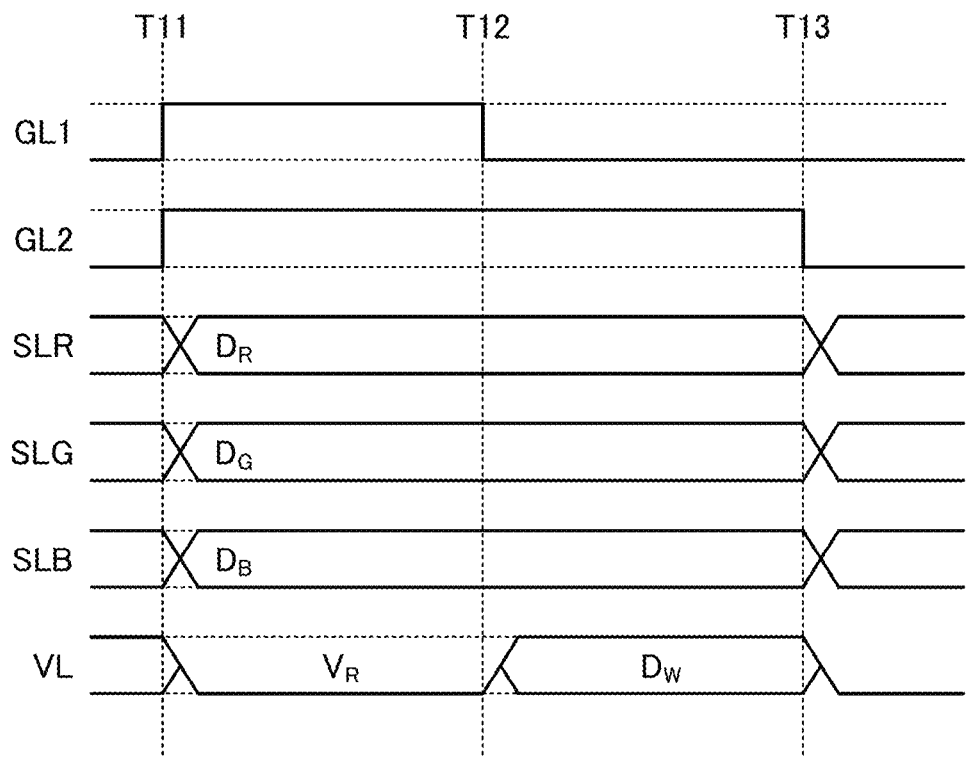
FIGS. 8A and 8B are timing charts each illustrating a method for driving the display device.

An example of a method for driving the pixel 20 shown in FIG. 6 is described below with reference to a timing chart in FIG. 8A. FIG. 8A shows signals input to the wirings GL1, GL2, SLR, SLG, SLB, and VL.

<Before Time T11>

Before Time T11, a potential for turning off the transistor (here, a low-level potential) is applied to the wirings GL1 and GL2. Data to be written to pixels in the previous row is supplied to the wirings SLR, SLG, SLB, and VL.

<Period T11-T12>

At Time T11, a potential for turning on the transistor (here, a high-level potential) is applied to the wirings GL1 and GL2. In addition, data potentials $D_R$, $D_G$, and $D_B$ are applied to the wirings SLR, SLG, and SLB, respectively. Furthermore, the reset potential $V_R$ is applied to the wiring VL.

In the period T11-T12, the transistors M1, M3, and M4 are turned on. The reset potential $V_R$ is supplied to an anode electrode of each light-emitting element through the transistor M4. In addition, the reset potential $V_R$ is supplied to the second electrode of the capacitor C1 through the transistor M3. Furthermore, the data potential $D_R$, $D_G$, or $D_B$ is supplied to the gate of the transistor M2 through the transistor M1.

At this time, the reset potential $V_R$ is applied to the anode electrodes of the light-emitting elements ELR, ELG, and ELB. When the reset potential $V_R$ is set so that voltage between the pair of electrodes of each of the light-emitting elements does not exceed the threshold voltage, unintended light is not emitted from each of the light-emitting elements.

<Period T12-T13>

Then, at Time T12, a low-level potential is applied to the wiring GL1, a high-level potential is applied to the wiring GL2, and the data potential $D_W$ is applied to the wiring VL.

The transistor M1 is turned off, so that the gate of the transistor M2 is brought into a floating state. The potential of the gate of the transistor M2 can be changed by capacitive coupling when the data potential $D_W$ is applied to the second electrode of the capacitor C1 through the transistor M3.

Here, the data potential $D_W$ is applied to the subpixels 21R, 21G, and 21B. Thus, the emission luminance of the light-emitting elements of the subpixels 21R, 21G, and 21B can be corrected in a similar manner. For example, a high-level potential is applied as the data potential $D_W$, so that the emission luminance of the light-emitting elements of the subpixels 21R, 21G, and 21B can be increased uniformly.

With such a driving method, emission luminance can be adjusted for each of the pixels 20, so that what is called pixel dimming can be achieved. Luminance is optimally corrected in accordance with an image to be displayed, so that high-quality display can be achieved. In addition, in a conventional display device, video data needs to be generated by addition of data for display and data for correction and needs to be supplied to pixels. In contrast, in one embodiment of the present invention, data for display and data for correction can be independently supplied, so that a configuration of a driver circuit or the like can be simplified.

In addition, the wiring VL is shared by the plurality of subpixels, so that the amount of correction data to be supplied to the wiring VL can be reduced. Accordingly, frame frequency can be increased and power consumption can be reduced.

<At and After Time T13>

At Time T13, a low-level potential is applied to the wiring GL2. Thus, operation of writing data to the pixels 20 is completed. After Time T13, writing operation for the next row is performed.

Driving Method Example 2-2

Figure 8B:
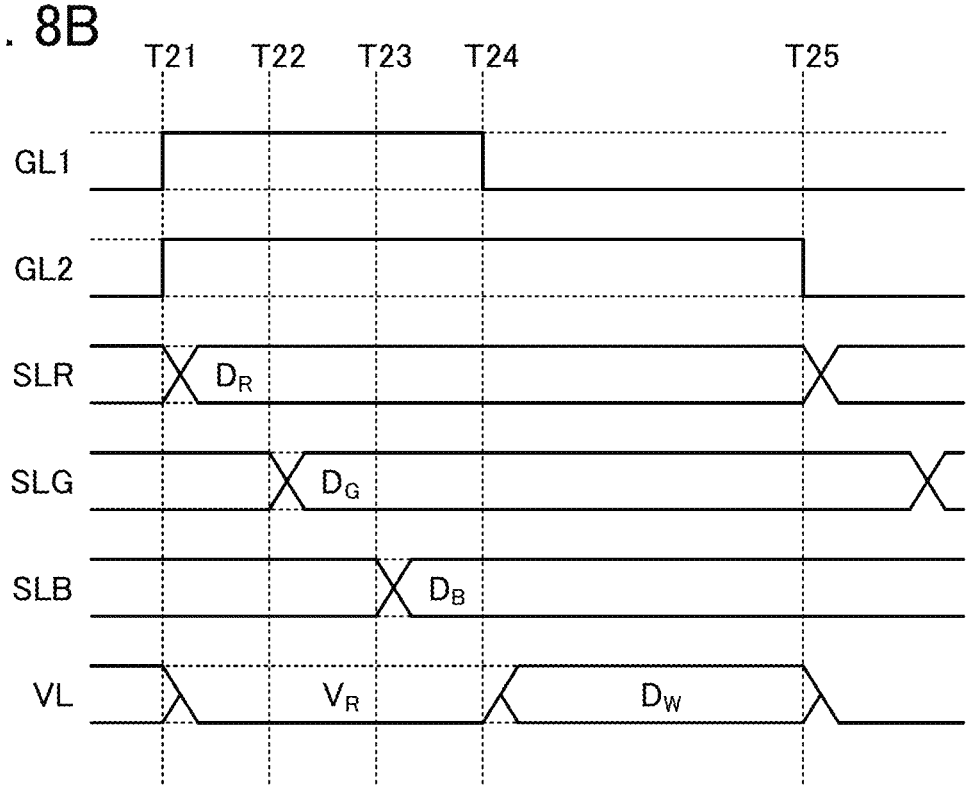

A driving method example that is different from Driving method example 2-1 is described below with reference to a timing chart in FIG. 8B. Here, an example in which the driver circuit portion 12 that supplies a data potential to the wirings SLR, SLG, and SLB includes a demultiplexer circuit is described.

The demultiplexer circuit has a function of time-dividing one data signal to be input and outputting the data signal to a plurality of wirings. Here, an example in which data potentials are sequentially supplied to the wirings SLR, SLG, and SLB from one demultiplexer circuit is described.

<Before Time T21>

Before Time T21, a potential for turning off the transistor (here, a low-level potential) is applied to the wirings GL1 and GL2. Data to be written to pixels in the previous row is supplied to the wirings SLR, SLG, SLB, and VL.

<Period T21-T22>

At Time T21, a potential for turning on the transistor (here, a high-level potential) is applied to the wirings GL1 and GL2. In addition, the data potential $D_R$ is applied to the wiring SLR. Data to be written to the pixels in the previous row is supplied to the wirings SLG and SLB. Furthermore, the reset potential $V_R$ is applied to the wiring VL.

At this time, data to be written to the pixels in the previous rows is applied to the subpixels 21G and 21B. However, the reset potential $V_R$ is applied to the anode electrodes of the light-emitting elements ELG and ELB; thus, when the reset potential $V_R$ is set so that voltage between the pair of electrodes of each of the light-emitting elements does not exceed the threshold voltage, unintended light is not emitted from each of the light-emitting elements. The data potential $D_R$ is written to the subpixel 21R, and light is not emitted from the light-emitting element ELR in a similar manner. Accordingly, light is not emitted from each of the light-emitting elements until the data potential $D_W$ is written to each of the subpixels, so that display of an unintended image that decreases display quality can be prevented.

<Period T22-T23>

At Time T22, while the potential for turning on the transistor is continuously applied to the wirings GL1 and GL2, the data potential $D_G$ is applied to the wiring SLG and is written to the subpixel 21G. At this time, the data potential $D_R$ is applied to the wiring SLR, and data to be written to the pixels in the previous row is supplied to the wiring SLB. Note that also at this time, light is not emitted from the light-emitting elements ELR, ELG, and ELB.

<Period T23-T24>

At Time T23, while the potential for turning on the transistor is continuously applied to the wirings GL1 and GL2, the data potential $D_B$ is applied to the wiring SLB and is written to the subpixel 21B. At this time, the data potential $D_R$ is applied to the wiring SLR, and the data potential $D_G$ is applied to the wiring SLG. Note that also at this time, light is not emitted from the light-emitting elements ELR, ELG, and ELB.

<Period T24-T25>

Then, at Time T24, a low-level potential is applied to the wiring GL1, a high-level potential is applied to the wiring GL2, and the data potential $D_W$ is applied to the wiring VL. Thus, the light-emitting elements included in the subpixels can emit light with luminance corrected by the data potential $D_W$.

The above is the description of the example of the driving method.

Note that although the method for driving the pixel 20 is described here, a similar driving method can be applied to the pixel 20a.

Modification Example 2-1

The display device 10a shown in FIG. 5 has a structure in which one wiring VL is provided for one pixel 20; however, one wiring VL may be connected to a plurality of pixels 20.

Figure 9A:
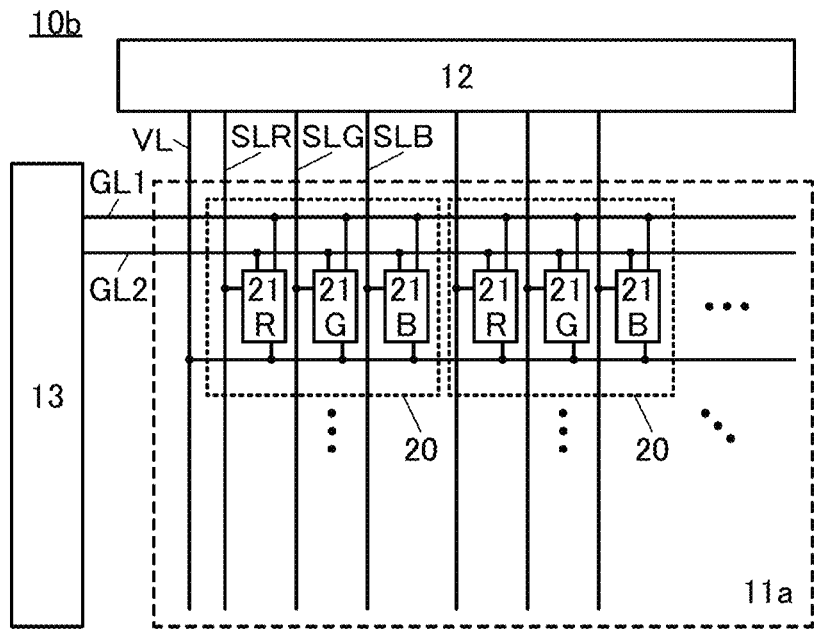
FIGS. 9A and 9B are block diagrams of display devices.

FIG. 9A is a block diagram of a display device 10b.

In the example of the display device 10b, one wiring VL is electrically connected to all the pixels 20. The reset potential $V_R$ and the data potential $D_W$ are applied to the subpixels 21R, 21G, and 21B in a plurality of pixels 20 arranged in a row direction. Thus, correction data can be written row by row.

In the display device 10b, the number of the wirings VL supplied with the reset potential $V_R$ and the data potential $D_W$ can be significantly reduced. Accordingly, a display device with extremely high definition can be achieved.

Figure 9B:
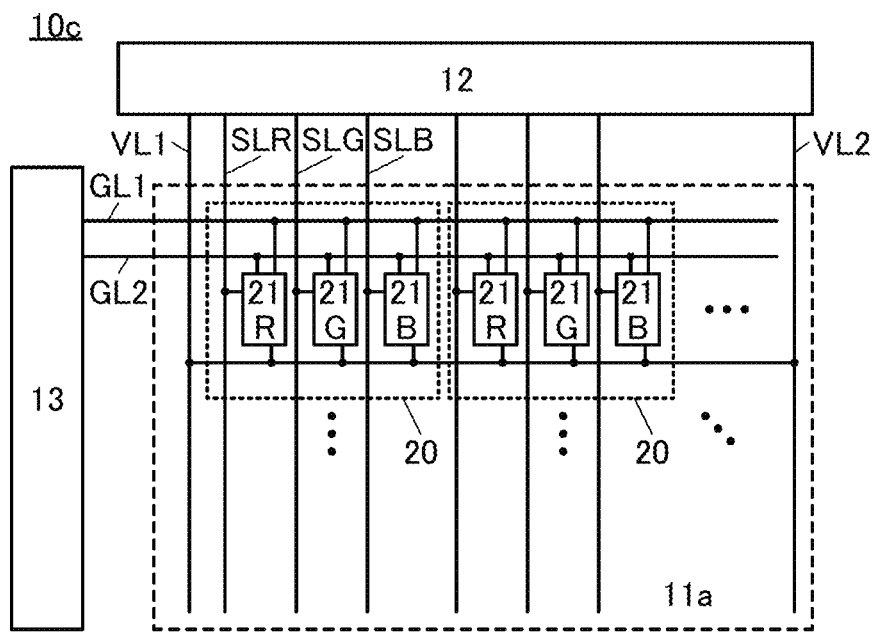

In the case where the area of the display portion 11a is large or the number of pixels 20 arranged in the row direction is large, there might be a difference between a potential applied to the pixel 20 that is close to the wiring VL and a potential applied to the pixel 20 that is far from the wiring VL due to the influence of the electric resistance of the wiring VL. Thus, a structure of a display device 10c shown in FIG. 9B can inhibit such a problem.

The display device 10c includes a wiring VL1 and a wiring VL2 at both ends of the display portion 11a. The same signal is output from the driver circuit portion 12 to the wirings VL1 and VL2. By inputting the same signals (the reset potential $V_R$ and the data potential $D_W$) to the pixels 20 from both of the ends of the display portion 11a in this manner, the above problem can be favorably inhibited.

Note that although the one wiring VL (or the pair of wirings VL1 and VL2) is connected to all the pixels 20 here, one embodiment of the present invention is not limited thereto. For example, one wiring VL may be provided for a plurality of pixels 20. In that case, what is called local dimming in which emission luminance is adjusted for a plurality of pixels can be achieved.

The above is the description of Structure example 2.

Structure Example 3

A display device according to one embodiment of the present invention may have an imaging function in addition to a function of displaying an image. Specifically, a pixel included in the display device can include a light-emitting element and a light-receiving element. An image of a target object can be captured by light-receiving elements arranged in a matrix. In addition, the light-emitting element can also be used as a light source for imaging by the light-receiving elements, and light that is emitted from the light-emitting element and is reflected in a target object can be detected by the light-receiving elements.

The display device according to one embodiment of the present invention can adjust the gradation of each pixel by using the second data potential (the data potential $D_W$). For example, when the light-emitting element is used as the light source for imaging, the emission luminance of each light-emitting element can be increased by using a potential that increases the gradation of the pixel as the second data potential. In addition, the display device according to one embodiment of the present invention can correct the gradation for each pixel or for multiple pixels; thus, the luminance of only pixels to be used as the light source can be increased.

For example, the display device can be applied to personal authentication by capturing an image of biological information such as a fingerprint or a palm print with the light-receiving elements. The display device can also be applied to a touch sensor by sensing positional information of a target object that touches the display portion. The display device can also be applied to an image scanner by capturing an image of an object, a printed material, or the like.

More specific examples are described below with reference to drawings.

Figure 10A:
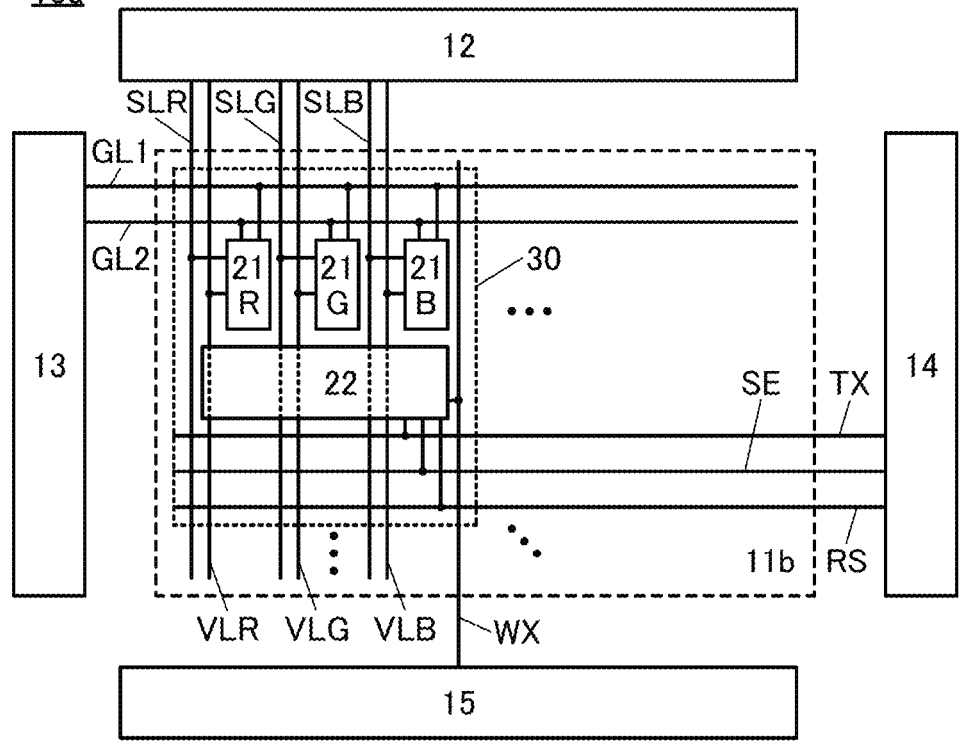
FIGS. 10A and 10B are block diagrams of display devices.

FIG. 10A is a block diagram of a display device 10d. The display device 10d includes a display portion 11b, the driver circuit portion 12, the driver circuit portion 13, a driver circuit portion 14, a circuit portion 15, and the like.

The display portion 11b includes a plurality of pixels 30 arranged in a matrix. The pixels 30 each include the subpixels 21R, 21G, and 21B and an imaging pixel 22. The imaging pixel 22 includes a light-receiving element that functions as a photoelectric conversion element.

The imaging pixel 22 is electrically connected to wirings TX, SE, RS, and WX. The wirings TX, SE, and RS are electrically connected to the driver circuit portion 14, and the wiring WX is electrically connected to the circuit portion 15.

The driver circuit portion 14 has a function of generating a signal for driving the imaging pixel 22 and outputting the signal to the imaging pixel 22 through the wirings SE, TX, and RS. The circuit portion 15 has a function of receiving a signal output from the imaging pixel 22 through the wiring WX and outputting the signal to the outside as image data. The circuit portion 15 functions as a read circuit.

In the example of the display device 10d, a wiring VLR connected to the subpixel 21R, a wiring VLG connected to the subpixel 21G, and a wiring VLB connected to the subpixel 21B are provided. The wirings VLR, VLG, and VLB are electrically connected to the driver circuit portion 12, and a reset potential and a data potential are supplied to the wirings VLR, VLG, and VLB from the driver circuit portion 12 in different periods.

Figure 10B:
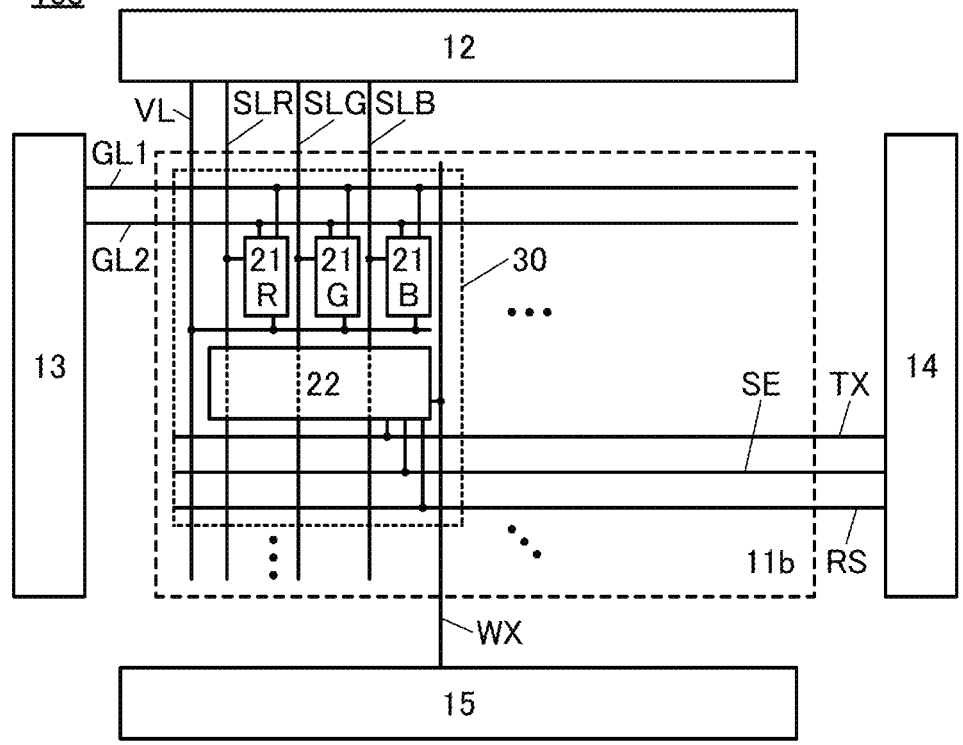

Note that one wiring VL may be provided for one pixel 30 like a display device 10e shown in FIG. 10B. In addition, as in Modification example 2-1 (FIGS. 9A and 9B), one wiring VL may be connected to a plurality of pixels 30.

Pixel Configuration Example 3-1

Figure 11A:
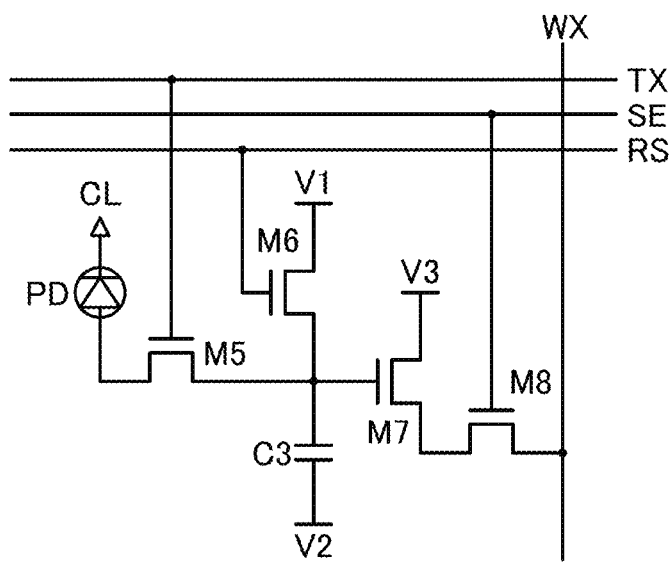
FIG. 11A is a pixel circuit diagram.

FIG. 11A shows an example of a circuit that can be used for the imaging pixel 22. The imaging pixel 22 includes a transistor M5, a transistor M6, a transistor M7, a transistor M8, a capacitor C3, and a light-receiving element PD.

A gate of the transistor M5 is electrically connected to the wiring TX. One of a source and a drain of the transistor M5 is electrically connected to an anode electrode of the light-receiving element PD. The other of the source and the drain of the transistor M5 is electrically connected to one of a source and a drain of the transistor M6, a first electrode of the capacitor C3, and a gate of the transistor M7. A gate of the transistor M6 is electrically connected to the wiring RS. The other of the source and the drain of the transistor M6 is electrically connected to a wiring V1. One of a source and a drain of the transistor M7 is electrically connected to a wiring V3. The other of the source and the drain of the transistor M7 is electrically connected to one of a source and a drain of the transistor M8. A gate of the transistor M8 is electrically connected to the wiring SE. The other of the source and the drain of the transistor M8 is electrically connected to the wiring WX. A cathode electrode of the light-receiving element PD is electrically connected to the wiring CL. A second electrode of the capacitor C3 is electrically connected to a wiring V2.

The transistors M5, M6, and M8 function as switches. The transistor M7 functions as an amplifier element (an amplifier).

The wirings TX, SE, and RS are supplied with signals for controlling the conduction and non-conduction of the transistors to which the wirings TX, SE, and RS are connected. The data potential $D_S$ is output from the imaging pixel 22 to the wiring WX.

Fixed potentials are applied to the wirings V1 and V3. The potential applied to the wiring V1 and the potential applied to the wiring V3 can be selected in accordance with the configuration of the read circuit included in the circuit portion 15. Either a fixed potential or two or more different potentials may be applied to the wiring V2. The wiring CL is the wiring to which a cathode potential is applied. Here, a potential higher than the potential of the wiring V1 is applied to the wiring CL so that a reverse bias is applied to the light-receiving element PD.

Figure 12:
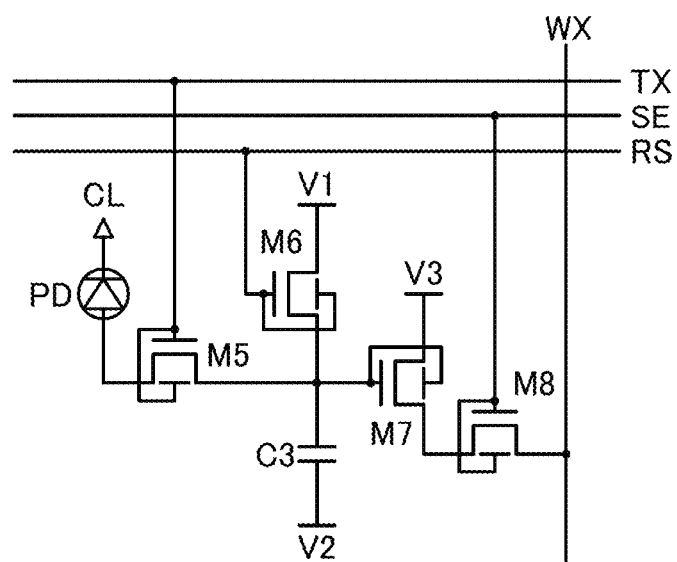
FIG. 12 is a pixel circuit diagram.

Note that the transistors may each include a back gate, as shown in FIG. 12. In FIG. 12, a pair of gates of each transistor is electrically connected to each other.

Note that although the pair of gates of each transistor is electrically connected to each other in FIG. 12, one embodiment of the present invention is not limited thereto. The imaging pixel 22 may include a transistor in which one of gates is connected to another wiring. For example, when one of a pair of gates of a transistor is connected to a wiring to which a fixed potential is applied, the stability of electrical characteristics can be improved. Alternatively, one of a pair of gates of a transistor may be connected to a wiring to which a potential for controlling the threshold voltage of the transistor is applied.

Although the example in which the four transistors each include a back gate is shown here, a transistor that includes a back gate and a transistor that does not include a back gate may be used in combination.

Driving Method Example 3-1

Figure 11B:
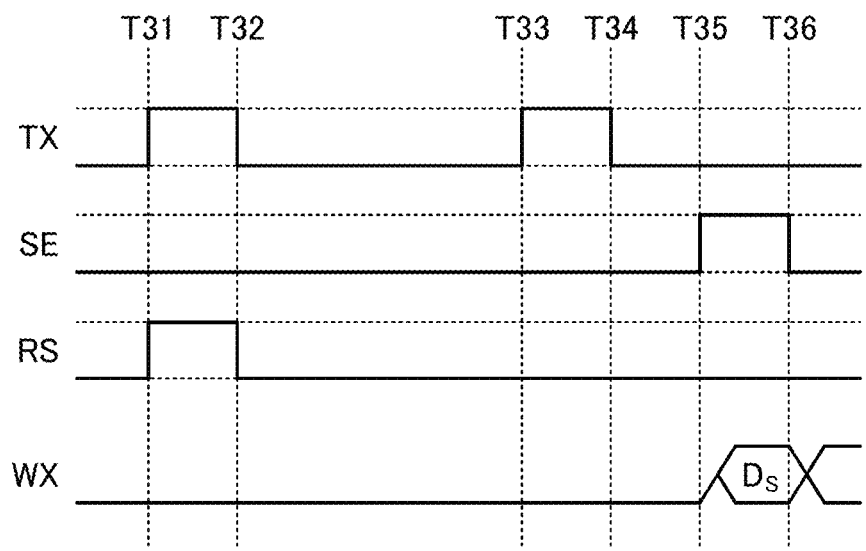
FIG. 11B is a timing chart illustrating a method for driving the display device.

An example of a method for driving the imaging pixel 22 is described below with reference to a timing chart in FIG. 11B. FIG. 11B shows signals input to the wirings TX, SE, RS, and WX.

<Before Time T31>

Before Time T31, low-level potentials are applied to the wirings TX, SE, and RS. Data is not output to the wiring WX, and the wiring WX is regarded as being set to a low-level potential here. Note that a predetermined potential may be applied to the wiring WX.

<Period T31-T32>

At Time T31, a potential for turning on the transistor (here, a high-level potential) is applied to the wirings TX and RS. In addition, a potential for turning off the transistor (here, a low-level potential) is applied to the wiring SE.

At this time, the transistors M5 and M6 are turned on, so that a potential lower than the potential of the cathode electrode of the light-receiving element PD is applied to the anode electrode of the light-receiving element PD from the wiring V1 through the transistors M6 and M5. That is, reverse bias voltage is applied to the light-receiving element PD.

In addition, the potential of the wiring V1 is also supplied to the first electrode of the capacitor C3, so that charge is stored in the capacitor C3.

The period T31-T32 can also be referred to as a reset (initialization) period.

<Period T32-T33>

At Time T32, low-level potentials are applied to the wirings TX and RS. Thus, the transistors M5 and M6 are turned off.

The transistor M5 is turned off, so that the reverse bias voltage is retained in the light-receiving element PD. Here, photoelectric conversion is caused by incident light on the light-receiving element PD, and charge is accumulated in the anode electrode of the light-receiving element PD.

The period T32-T33 can also be referred to as an exposure period. The exposure period is set in accordance with the sensitivity of the light-receiving element PD, the amount of incident light, or the like and is preferably set to be much longer than at least a reset period.

In addition, in the period T32-T33, the transistors M5 and M6 are turned off, so that the potential of the first electrode of the capacitor C3 is held at a low-level potential supplied from the wiring V1.

<Period T33-T34>

At Time T33, a high-level potential is applied to the wiring TX. Thus, the transistor M5 is turned on, and the charge accumulated in the light-receiving element PD is transferred to the first electrode of the capacitor C3 through the transistor M5. Accordingly, the potential of a node to which the first electrode of the capacitor C3 is connected becomes higher in accordance with the amount of charge accumulated in the light-receiving element PD. Consequently, a potential corresponding to the amount of light to which the light-receiving element PD is exposure is applied to the gate of the transistor M7.

<Period T34-T35>

At Time T34, a low-level potential is applied to the wiring TX. Thus, the transistor M5 is turned off, and a node to which the gate of the transistor M7 is connected is brought into a floating state. Since the light-receiving element PD is continuously exposed to light, a change in the potential of the node to which the gate of the transistor M7 is connected can be prevented by turning off the transistor M5 after the transfer operation in the period T33-T34 is completed.

<Period T35-T36>

At Time T35, a high-level potential is applied to the wiring SE. Thus, the transistor M8 is turned on. The period T35-T36 can be referred to as a read period.

For example, a source follower circuit is composed of the transistor M7 and a transistor included in the circuit portion 15 so that data can be read. In that case, the data potential $D_S$ output to the wiring WX is determined in accordance with a gate potential of the transistor M7. Specifically, a potential obtained by subtracting the threshold voltage of the transistor M7 from the gate potential of the transistor M7 is output to the wiring WX as the data potential $D_S$, and the potential is read by the read circuit included in the circuit portion 15.

Note that a source ground circuit is composed of the transistor M7 and the transistor included in the circuit portion 15 so that data can be read by the read circuit included in the circuit portion 15.

<At and After Time T36>

At Time T36, a low-level potential is applied to the wiring SE. Thus, the transistor M8 is turned off. Accordingly, data reading in the imaging pixel 22 is completed. After Time T36, data reading operation is sequentially performed in the subsequent rows.

The above is the description of Driving method example 3-1.

Figure 13:
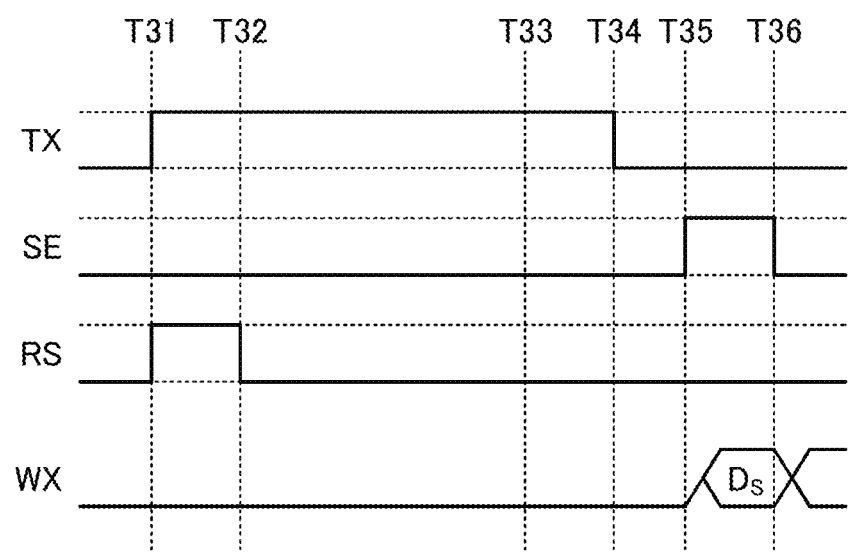
FIG. 13 is a timing chart illustrating a method for driving the display device.

Note that as shown in FIG. 13, a high-level potential may be applied to the wiring TX in the period T32-T33 that is the exposure period. At this time, the transistor M5 is on during the exposure period; thus, light exposure and transfer can be performed at the same time. Thus, the exposure period can be set long or driving frequency can be increased.

When the driving methods shown in FIGS. 11B and 13 are used, the exposure period and the read period can be set independently; therefore, light exposure can be concurrently performed on all the imaging pixels 22 in the display portion 11b, and then data can be sequentially read. Accordingly, what is called global shutter driving can be achieved. In the case of performing global shutter driving, a transistor including an oxide semiconductor, which has an extremely low leakage off-state current, is preferably used as a transistor functioning as a switch in the imaging pixel 22 (in particular, each of the transistors M5 and M6).

The above is the description of Structure example 3.

At least part of this embodiment can be implemented in combination with any of the other embodiments described in this specification as appropriate.

Embodiment 2

In this embodiment, a display device with an imaging function is described. A display device described below includes a light-emitting element and a light-receiving element. The display device includes a function of displaying an image, a function of performing position detection with reflected light from an object to be detected, and a function of performing capturing an image of a fingerprint or the like with reflected light from an object to be detected. The display device described below can also be regarded to have a function of a touch panel and a function of a fingerprint sensor.

A display device according to one embodiment of the present invention includes a light-emitting element emitting first light (a light-emitting device) and a light-receiving element receiving the first light (a light-receiving device).

That is, the light-receiving element is an element whose light-receiving wavelength range covers an emission wavelength of the light-emitting element. The light-receiving element is preferably a photoelectric conversion element. As the first light, visible light or infrared light can be used. In the case where infrared light is used as the first light, in addition to the light-emitting element emitting the first light, a light-emitting element emitting visible light can be included.

In addition, the display device includes a pair of substrates (also referred to as a first substrate and a second substrate). The light-emitting element and the light-receiving element are positioned between the first substrate and the second substrate. The first substrate is positioned on a display surface side, and the second substrate is positioned on a side opposite to the display surface side.

Visible light is emitted from the light-emitting element to the outside through the first substrate. The plurality of light-emitting elements arranged in a matrix are included in the display device, so that an image can be displayed.

The first light emitted from the light-emitting element reaches a surface of the first substrate. Here, when an object touches the surface of the first substrate, the first light is scattered at an interface between the first substrate and the object, and then part of the scattered light is incident on the light-receiving element. When the light-receiving element receives the first light, the light-receiving element can convert the first light into an electric signal in accordance with the intensity of the first light and output the electric signal. In the case where a plurality of light-receiving elements arranged in a matrix are included in the display device, positional data, shape, or the like of the object that touches the first substrate can be detected. That is, the display device can function as an image sensor panel, a touch sensor panel, or the like.

Note that even in the case where the object does not touch the surface of the first substrate, the first light that has passed the first substrate is reflected or scattered in the surface of the object, and reflected light or scattered light is incident on the light-receiving element through the first substrate. Thus, the display device can also be used as a non-contact touch sensor panel (also referred to as a near-touch panel).

In the case where visible light is used as the first light, the first light used for image display can be used as a light source of a touch sensor. In that case, the light-emitting element has a function of a display element and a function of a light source, so that the structure of the display device can be simplified. In contrast, in the case where infrared light is used as the first light, a user does not perceive the infrared light, so that imaging or sensing can be performed by the light-receiving element without a reduction in visibility of a display image.

In the case where infrared light is used as the first light, infrared light, preferably near-infrared light is used. In particular, near-infrared light having one or more peaks in the range of a wavelength of greater than or equal to 700 nm and less than or equal to 2500 nm can be favorably used. In particular, the use of light having one or more peaks in the range of a wavelength of greater than or equal to 750 nm and less than or equal to 1000 nm is preferable because it permits an extensive choice of a material used for an active layer of the light-receiving element.

When a fingertip touches a surface of the display device, the image of a shape of a fingerprint can be captured. The fingerprint has a projection and a depression. The first light is likely to be scattered in the projection of the fingerprint that touches the surface of the first substrate. Therefore, the intensity of scattered light that is incident on the light-receiving element overlapping with the projection of the fingerprint is high and the intensity of scattered light that is incident on the light-receiving element overlapping with the depression of the fingerprint is low. Accordingly, the image of the fingerprint can be captured. A device including a display device according to one embodiment of the present invention can perform fingerprint authentication that is a kind of biological authentication by utilizing a captured fingerprint image.

In addition, the display device can also capture the image of a blood vessel, especially a vein of a finger, a hand, or the like. For example, light having a wavelength of 760 nm and its vicinity is not absorbed by reduced hemoglobin in the vein, so that the position of the vein can be detected by making an image from reflected light from a palm, a finger, or the like that is received by the light-receiving element. A device including a display device according to one embodiment of the present invention can perform vein authentication that is a kind of biological authentication by utilizing a captured vein image.

In addition, the device including a display device according to one embodiment of the present invention can perform touch sensing, fingerprint authentication, and vein authentication at the same time. Thus, high-security biological authentication can be performed at low cost without increasing the number of components.

The light-receiving element is preferably an element capable of receiving visible light and infrared light. In that case, the light-emitting element preferably includes a light-emitting element emitting infrared light and a light-emitting element emitting visible light. Accordingly, visible light is reflected by a user's finger and reflected light is received by the light-receiving element, so that the image of a shape of a fingerprint can be captured. Furthermore, the image of a shape of a vein can be captured with infrared light. Accordingly, both fingerprint authentication and vein authentication can be performed in one display device. Moreover, fingerprint imaging and vein imaging may be performed either at different timings or at the same time. In the case where fingerprint imaging and vein imaging are performed at the same time, image data including both data on a fingerprint shape and data on a vein shape can be obtained, so that biological authentication with higher accuracy can be achieved.

Alternatively, the display device according to one embodiment of the present invention may have a function of detecting a user's health condition. For example, by utilizing changes in reflectance and transmittance with respect to visible light and infrared light in accordance with a change in blood oxygen saturation and obtaining a time change in the oxygen saturation, a heart rate can be measured. Furthermore, a glucose concentration in dermis, a neutral fats concentration in the blood, or the like can also be measured by infrared light or visible light. The device including the display device according to one embodiment of the present invention can be used as a health care device capable of obtaining index data on a user's health condition.

A sealing substrate for sealing the light-emitting element, a protective film, or the like can be used for the first substrate. In addition, a resin layer may be provided between the first substrate and the second substrate to attach the first substrate and the second substrate to each other.

Here, as the light-emitting element, an EL element such as an organic light-emitting diode (OLED) or a quantum-dot light-emitting diode (QLED) is preferably used. As a light-emitting substance of the EL element, a substance emitting fluorescence (a fluorescent material), a substance emitting phosphorescence (a phosphorescent material), a substance exhibiting thermally activated delayed fluorescence (a thermally activated delayed fluorescent (TADF) material), an inorganic compound (e.g., a quantum dot material), or the like can be used. Alternatively, an LED such as a micro-LED can be used as the light-emitting element.

As the light-receiving device, a PN photodiode or a PIN photodiode can be used, for example. The light-receiving element functions as a photoelectric conversion element that detects light incident on the light-receiving element and generates charge. The amount of generated charge in the photoelectric conversion element is determined depending on the amount of incident light. It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

The light-emitting element can have a stacked-layer structure including a light-emitting layer between a pair of electrodes, for example. The light-receiving element can have a stacked-layer structure including an active layer between the pair of electrodes. A semiconductor material can be used for the active layer of the light-receiving element. For example, an inorganic semiconductor material such as silicon can be used.

An organic compound is preferably used for the active layer of the light-receiving element. In that case, the light-emitting element and one electrode (also referred to as a pixel electrode) of the light-receiving element are preferably provided on the same plane. In addition, the light-emitting element and the other electrode of the light-receiving element are further preferably formed using one continuous conductive layer (also referred to as a common electrode). Furthermore, it is still further preferable that the light-emitting element and the light-receiving element include a common layer. Thus, the manufacturing process of the light-emitting element and the light-receiving element can be simplified, so that the manufacturing cost can be reduced and the manufacturing yield can be increased.

More specific examples are described below with reference to drawings.

Structure Example 1 of Display Panel

Structure Example 1-1

Figure 14A:
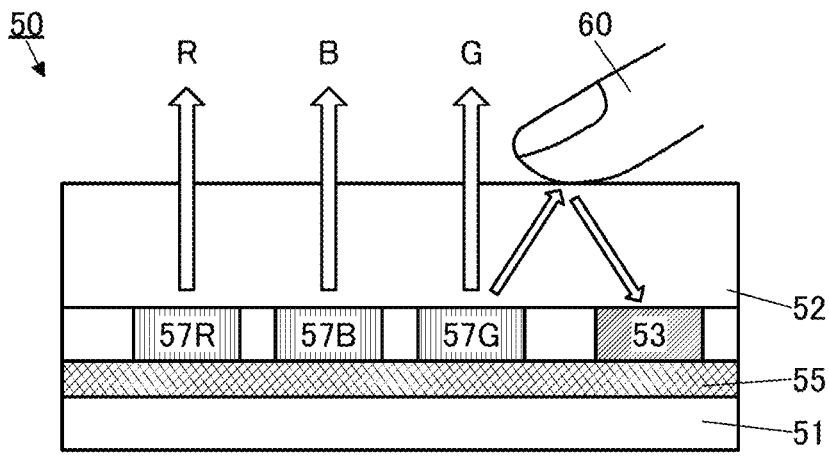
FIGS. 14A, 14B, 14D, and 14F to 14H each show a structure example of a display device, and FIGS. 14C and 14E each show an example of an image.

FIG. 14A is a schematic diagram of a display panel 50. The display panel 50 includes a substrate 51, a substrate 52, a light-receiving element 53, a light-emitting element 57R, a light-emitting element 57G, a light-emitting element 57B, a functional layer 55, and the like.

The light-emitting elements 57R, 57G, and 57B and the light-receiving element 53 are provided between the substrate 51 and the substrate 52.

The light-emitting elements 57R, 57G, and 57B emit red (R) light, green (G) light, and blue (B) light, respectively.

The display panel 50 includes a plurality of pixels arranged in a matrix. One pixel includes at least one subpixel. One subpixel includes one light-emitting element. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 53. The light-receiving element 53 may be provided in all the pixels or in some of the pixels. In addition, one pixel may include a plurality of light-receiving elements 53.

FIG. 14A shows a state where a finger 60 touches a surface of the substrate 52. Part of light emitted from the light-emitting element 57G is reflected or scattered in a contact portion of the substrate 52 and the finger 60. In the case where part of reflected light or scattered light is incident on the light-receiving element 53, the contact of the finger 60 with the substrate 52 can be detected. That is, the display panel 50 can function as a touch panel.

The functional layer 55 includes a circuit for driving the light-emitting elements 57R, 57G, and 57B, and a circuit for driving the light-receiving element 53. The functional layer 55 includes a switch, a transistor, a capacitor, a wiring, and the like. Note that in the case where the light-emitting elements 57R, 57G, and 57B and the light-receiving element 53 are driven by a passive-matrix method, the functional layer 55 does not necessarily include a switch or a transistor.

Figure 14B:
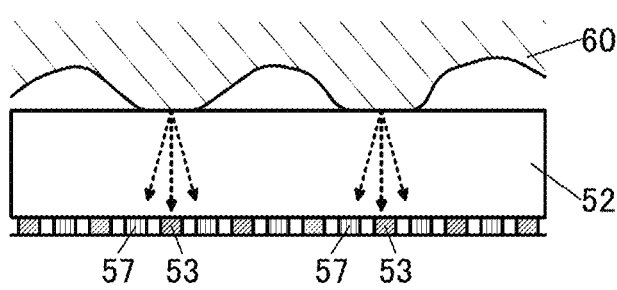

The display panel 50 may have a function of detecting a fingerprint of the finger 60. FIG. 14B schematically shows an enlarged view of the contact portion when the finger 60 touches the substrate 52. FIG. 14B shows light-emitting elements 57 and the light-receiving elements 53 that are alternately arranged.

The fingerprint of the finger 60 is formed of depressions and projections. Therefore, as shown in FIG. 14B, the projections of the fingerprint touch the substrate 52, and scattered light (indicated by dashed-dotted arrows) occurs on surfaces where the projections of the fingerprint touch the substrate 52.

As shown in FIG. 14B, in the intensity distribution of the scattered light on the surface where the finger 60 touches the substrate 52, the intensity of light almost perpendicular to the contact surface is the highest, and the intensity of light becomes lower as an angle becomes larger in an oblique direction. Thus, the intensity of light received by the light-receiving element 53 positioned directly below the contact surface (i.e., positioned in a portion overlapping with the contact surface) is the highest. Scattered light at greater than or equal to a predetermined scattering angle is fully reflected in the other surface (a surface opposite to the contact surface) of the substrate 52 and does not pass through the light-receiving element 53. As a result, a clear fingerprint image can be captured.

In the case where an arrangement interval between the light-receiving elements 53 is smaller than a distance between two projections of the fingerprint, preferably a distance between a depression and a projection adjacent to each other, a clear fingerprint image can be obtained. A distance between a depression and a projection of a human's fingerprint is approximately 200 μm; thus, the arrangement interval between the light-receiving elements 53 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 14C:
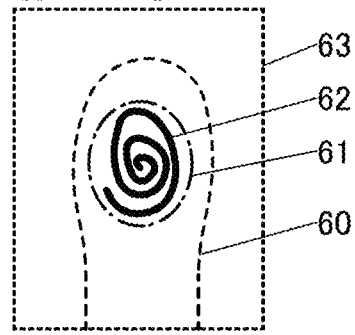

FIG. 14C shows an example of a fingerprint image captured with the display panel 50. In FIG. 14C, in an imaging range 63, the outline of the finger 60 is indicated by a dashed-dotted line and the outline of a contact portion 61 is indicated by a dashed line. In the contact portion 61, the image of a high-contrast fingerprint 62 can be captured by a difference in light incident on the light-receiving element 53.

Figure 14D:
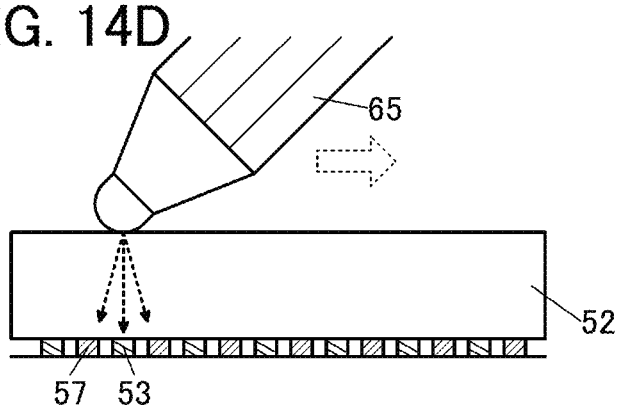

The display panel 50 can also function as a touch panel or a pen tablet. FIG. 14D shows a state in which a tip of a stylus 65 slides in a direction indicated by a dashed-dotted arrow while the tip of the stylus 65 touches the substrate 52.

As shown in FIG. 14D, when light scattered in the tip of the stylus 65 and the contact surface of the substrate 52 is incident on the light-receiving element 53 that overlaps with the contact surface, the position of the tip of the stylus 65 can be detected with high accuracy.

Figure 14E:
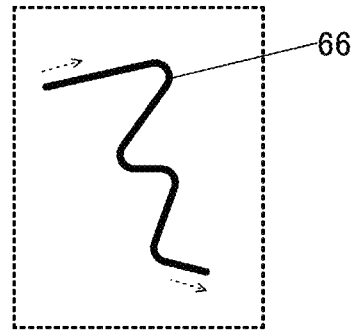

FIG. 14E shows an example of a path 66 of the stylus 65 that is detected in the display panel 50. The display panel 50 can detect the position of an object to be detected, such as the stylus 65, with high accuracy, so that high-definition drawing can be performed using a drawing application or the like. Unlike the case of using a capacitive touch sensor, an electromagnetic induction touch pen, or the like, the display panel 50 can detect even the position of a highly insulating object to be detected, the material of a tip portion of the stylus 65 is not limited, and a variety of writing materials (e.g., a brush, a glass pen, a quill pen, and the like) can be used.

Figure 14F:
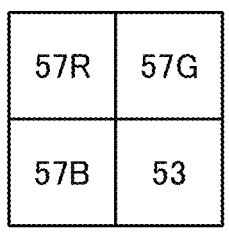
Figure 14G:
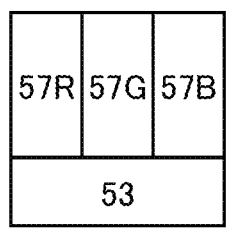
Figure 14H:
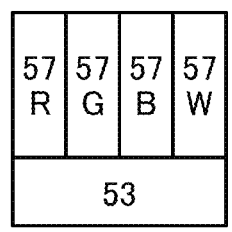

Here, FIGS. 14F to 14H show examples of pixels that can be used for the display panel 50.

Pixels shown in FIGS. 14F and 14G include the light-emitting elements 57R, 57G, and 57G for red (R), green (G), and blue (B), respectively, and the light-receiving element 53. The pixels each include a pixel circuit for driving the light-emitting elements 57R, 57G, and 57B and the light-receiving element 53.

FIG. 14F shows an example in which three light-emitting elements and one light-receiving element are provided in a matrix of 2×2. FIG. 14G shows an example in which three light-emitting elements are arranged in one column and one laterally long light-receiving element 53 is provided below the three light-emitting elements.

The pixel shown in FIG. 14H includes a light-emitting element 57W for white (W). Here, four light-emitting elements are arranged in one column and the light-receiving element 53 is provided below the four light-emitting elements.

Note that the pixel configuration is not limited to the above configuration, and a variety of pixel arrangements can be employed.

Structure Example 1-2

An example of a structure including a light-emitting element emitting visible light, a light-emitting element emitting infrared light, and a light-receiving element is described below.

Figure 15A:
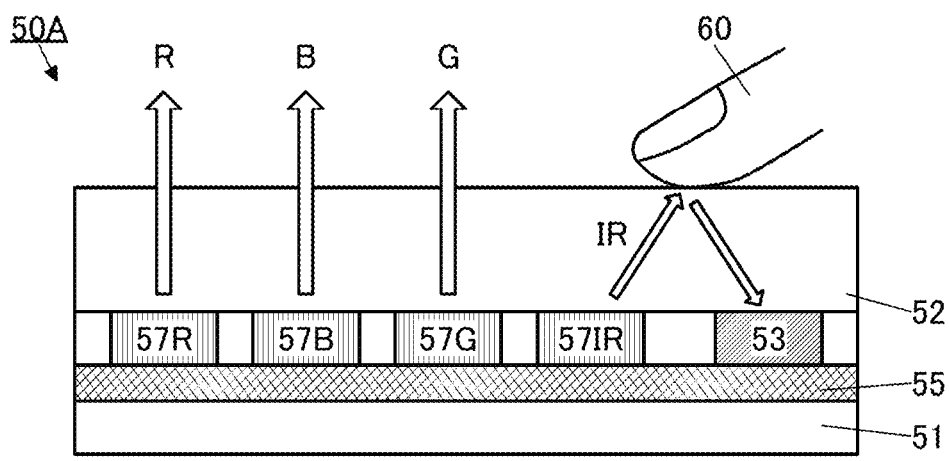
FIGS. 15A to 15D each show a structure example of a display device.

A display panel 50A shown in FIG. 15A includes a light-emitting element 57IR in addition to the components shown in FIG. 14A. The light-emitting element 57IR is a light-emitting element emitting infrared light IR. Moreover, in that case, an element capable of receiving at least the infrared light IR emitted from the light-emitting element 57IR is preferably used as the light-receiving element 53. As the light-receiving element 53, an element capable of receiving visible light and infrared light is further preferably used.

As shown in FIG. 15A, when the finger 60 touches the substrate 52, the infrared light IR emitted from the light-emitting element 57IR is reflected or scattered by the finger 60 and part of reflected light or scattered light is incident on the light-receiving element 53, so that the positional information of the finger 60 can be obtained.

Figure 15B:
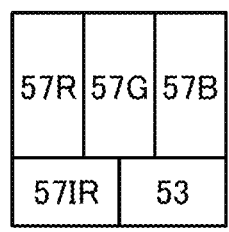
Figure 15C:
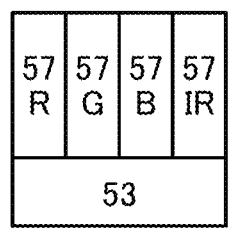
Figure 15D:
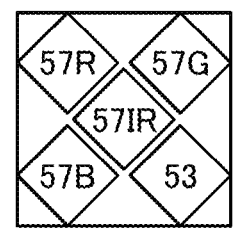

FIGS. 15B to 15D show examples of pixels that can be used for the display panel 50A.

FIG. 15B shows an example in which three light-emitting elements are arranged in one column and the light-emitting element 57IR and the light-receiving element 53 are arranged below the three light-emitting elements in a horizontal direction. FIG. 15C shows an example in which four light-emitting elements including the light-emitting element 57IR are arranged in one column and the light-receiving element 53 is provided below the four light-emitting elements.

FIG. 15D shows an example in which three light-emitting elements and the light-receiving element 53 arranged in all directions with the light-emitting element 57IR used as a center.

Note that in the pixels shown in FIGS. 15B to 15D, the positions of the light-emitting elements can be interchangeable, or the positions of the light-emitting element and the light-receiving element can be interchangeable.

The above is the description of Structure example 1 of display panel.

Structure Example 2 of Display Panel

Structure Example 2-1

Figure 16A:
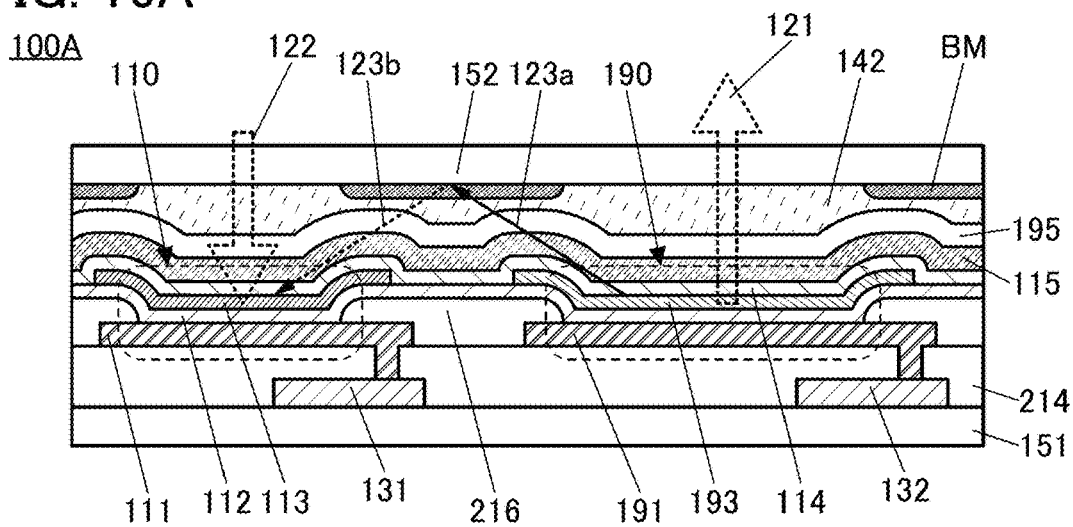
FIGS. 16A to 16C each show a structure example of a display device.

FIG. 16A is a schematic cross-sectional view of a display panel 100A.

The display panel 100A includes a light-receiving element 110 and a light-emitting element 190. The light-receiving element 110 includes a pixel electrode 111, a common layer 112, an active layer 113, a common layer 114, and a common electrode 115. The light-emitting element 190 includes a pixel electrode 191, the common layer 112, a light-emitting layer 193, the common layer 114, and the common electrode 115.

The pixel electrode 111, the pixel electrode 191, the common layer 112, the active layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is shared by the light-receiving element 110 and the light-emitting element 190.

The active layer 113 overlaps with the pixel electrode 111 with the common layer 112 therebetween. The light-emitting layer 193 overlaps with the pixel electrode 191 with the common layer 112 therebetween. The active layer 113 includes a first organic compound, and the light-emitting layer 193 includes a second organic compound that is different from the first organic compound.

The common layer 114 is positioned over the common layer 112, the active layer 113, and the light-emitting layer 193. The common layer 114 is shared by the light-receiving element 110 and the light-emitting element 190.

The common electrode 115 includes a portion overlapping with the pixel electrode 111 with the common layer 112, the active layer 113, and the common layer 114 therebetween. The common electrode 115 further includes a portion overlapping with the pixel electrode 191 with the common layer 112, the light-emitting layer 193, and the common layer 114 therebetween. The common electrode 115 is shared by the light-receiving element 110 and the light-emitting element 190.

In the display panel of this embodiment, an organic compound is used for the active layer 113 of the light-receiving element 110. In the light-receiving element 110, the layers other than the active layer 113 can be common to the layers in the light-emitting element 190 (the EL element). Therefore, the light-receiving element 110 can be formed concurrently with the formation of the light-emitting element 190 only by adding a step of depositing the active layer 113 in the manufacturing process of the light-emitting element 190. The light-emitting element 190 and the light-receiving element 110 can be formed over one substrate. Accordingly, the light-receiving element 110 can be incorporated in the display panel without a significant increase in the number of manufacturing steps.

The display panel 100A shows an example in which the light-receiving element 110 and the light-emitting element 190 have a common structure except that the active layer 113 of the light-receiving element 110 and the light-emitting layer 193 of the light-emitting element 190 are separately formed. Note that the structures of the light-receiving element 110 and the light-emitting element 190 are not limited thereto. The light-receiving element 110 and the light-emitting element 190 may include a separately formed layer other than the active layer 113 and the light-emitting layer 193 (see display panels 100D, 100E, and 100F to be described later). The light-receiving element 110 and the light-emitting element 190 preferably include at least one layer used in common (common layer). Thus, the light-receiving element 110 can be incorporated in the display panel without a significant increase in the number of manufacturing steps.

The display panel 100A includes the light-receiving element 110, the light-emitting element 190, a transistor 131, a transistor 132, and the like between a pair of substrates (a substrate 151 and a substrate 152).

In the light-receiving element 110, the common layer 112, the active layer 113, and the common layer 114 that are positioned between the pixel electrode 111 and the common electrode 115 can each be referred to as an organic layer (a layer containing an organic compound). The pixel electrode 111 preferably has a function of reflecting visible light. An end portion of the pixel electrode 111 is covered with a partition 216. The common electrode 115 has a function of transmitting visible light.

The light-receiving element 110 has a function of detecting light. Specifically, the light-receiving element 110 is a photoelectric conversion element that receives light 122 entering from the outside through the substrate 152 and converts the light 122 into an electrical signal.

A light-blocking layer BM is provided on a surface of the substrate 152 on the substrate 151 side. The light-blocking layer BM has an opening at a position overlapping with the light-receiving element 110 and an opening at a position overlapping with the light-emitting element 190. Providing the light-blocking layer BM can control the range where the light-receiving element 110 detects light.

For the light-blocking layer BM, a material that blocks light emitted from the light-emitting element can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

Here, part of light emitted from the light-emitting element 190 is reflected in the display panel 100A and is incident on the light-receiving element 110 in some cases. The light-blocking layer BM can reduce the influence of such stray light. For example, in the case where the light-blocking layer BM is not provided, light 123a emitted from the light-emitting element 190 is reflected by the substrate 152 and reflected light 123b is incident on the light-receiving element 110 in some cases. Providing the light-blocking layer BM can inhibit entry of the reflected light 123b into the light-receiving element 110. Consequently, noise can be reduced, and the sensitivity of a sensor using the light-receiving element 110 can be increased.

In the light-emitting element 190, the common layer 112, the light-emitting layer 193, and the common layer 114 that are positioned between the pixel electrode 191 and the common electrode 115 can each be referred to as an EL layer. The pixel electrode 191 preferably has a function of reflecting visible light. An end portion of the pixel electrode 191 is covered with the partition 216. The pixel electrode 111 and the pixel electrode 191 are electrically insulated from each other by the partition 216. The common electrode 115 has a function of transmitting visible light.

The light-emitting element 190 has a function of emitting visible light. Specifically, the light-emitting element 190 is an electroluminescent light-emitting element that emits light 121 toward the substrate 152 when voltage is applied between the pixel electrode 191 and the common electrode 115.

It is preferable that the light-emitting layer 193 be formed not to overlap with a light-receiving region of the light-receiving element 110. Accordingly, it is possible to inhibit the light-emitting layer 193 from absorbing the light 122, so that the amount of light with which the light-receiving element 110 is irradiated can be increased.

The pixel electrode 111 is electrically connected to a source or a drain of the transistor 131 through an opening provided in the insulating layer 214. The end portion of the pixel electrode 111 is covered with the partition 216.

The pixel electrode 191 is electrically connected to a source or a drain of the transistor 132 through an opening provided in the insulating layer 214. The end portion of the pixel electrode 191 is covered with the partition 216. The transistor 132 has a function of controlling driving of the light-emitting element 190.

The transistor 131 and the transistor 132 are on and in contact with the same layer (the substrate 151 in FIG. 16A).

At least part of a circuit electrically connected to the light-receiving element 110 is preferably formed using the same material in the same steps as a circuit electrically connected to the light-emitting element 190. Thus, the thickness of the display panel can be reduced and the manufacturing process can be simplified compared to the case where the two circuits are separately formed.

The light-receiving element 110 and the light-emitting element 190 are preferably covered with a protective layer 195. In FIG. 16A, the protective layer 195 is provided on and in contact with the common electrode 115. Providing the protective layer 195 can inhibit entry of impurities such as water into the light-receiving element 110 and the light-emitting element 190, so that the reliability of the light-receiving element 110 and the light-emitting element 190 can be increased. The protective layer 195 and the substrate 152 are attached to each other with an adhesive layer 142.

Figure 17A:
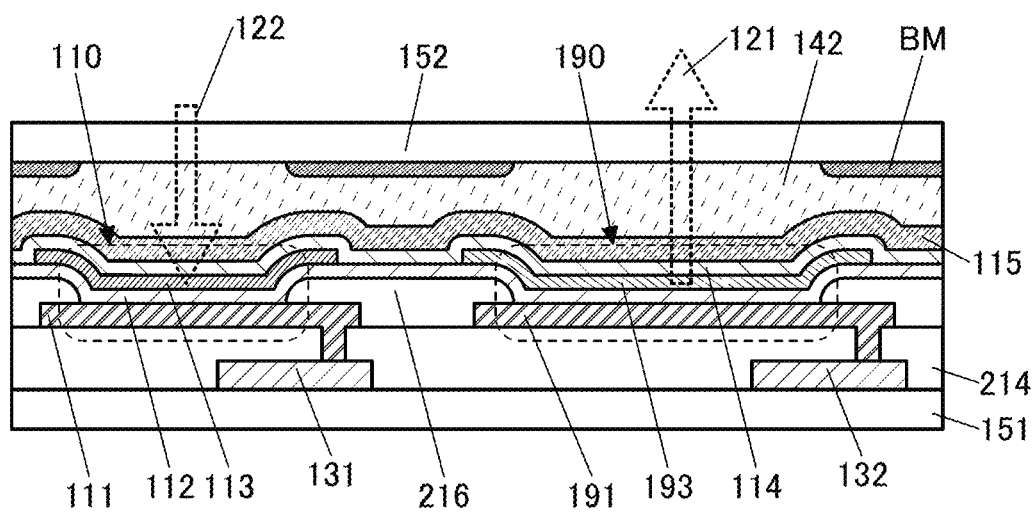
FIGS. 17A and 17B each show a structure example of a display device.

Note that as shown in FIG. 17A, the protective layer is not necessarily provided over the light-receiving element 110 and the light-emitting element 190. In FIG. 17A, the common electrode 115 and the substrate 152 are attached to each other with the adhesive layer 142.

Figure 17B:
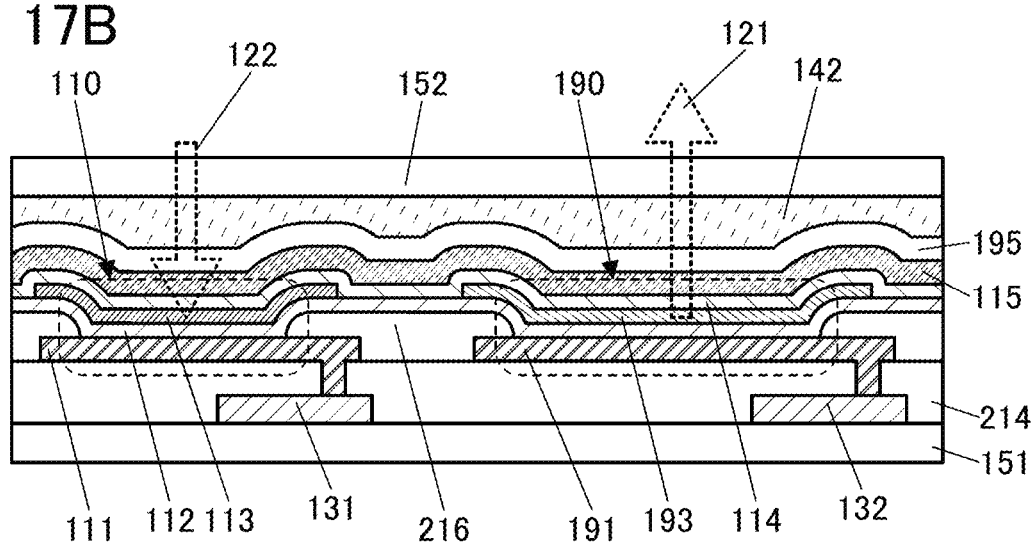

As shown in FIG. 17B, the light-blocking layer BM is not necessarily provided. This structure can increase the light-receiving area of the light-receiving element 110, so that the sensitivity of the sensor can be further increased.

Structure Example 2-2

Figure 16B:
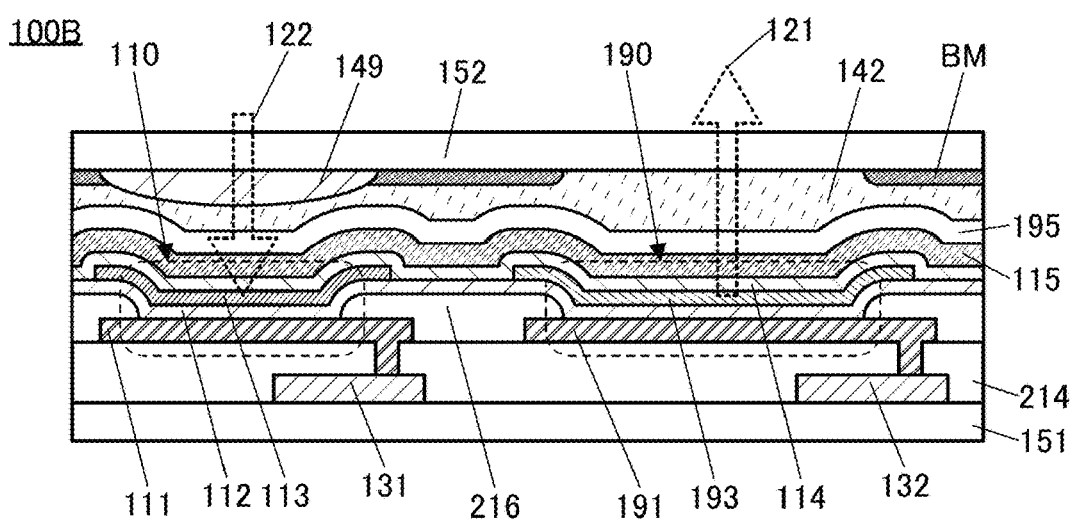

FIG. 16B is a cross-sectional view of a display panel 100B. Note that in the following description of display panels, the description of components similar to those of the above display panel might be omitted.

The display panel 100B shown in FIG. 16B includes a lens 149 in addition to the components of the display panel 100A.

The lens 149 is provided at a position overlapping with the light-receiving element 110. In the display panel 100B, the lens 149 is provided in contact with the substrate 152. The lens 149 included in the display panel 100B is a convex lens having a convex surface on the substrate 151 side. Note that convex lens having a convex surface on the substrate 152 side may be provided in a region overlapping with the light-receiving element 110.

In the case where the light-blocking layer BM and the lens 149 are formed on the same plane of the substrate 152, their formation order is not limited. FIG. 16B shows an example in which the lens 149 is formed first; alternatively, the light-blocking layer BM may be formed first. In FIG. 16B, an end portion of the lens 149 is covered with the light-blocking layer BM.

In the display panel 100B, the light 122 is incident on the light-receiving element 110 through the lens 149. With the lens 149, the amount of the light 122 incident on the light-receiving element 110 can be increased compared to the case where the lens 149 is not provided. This can increase the sensitivity of the light-receiving element 110.

As a method for forming the lens used in the display panel of this embodiment, a lens such as a microlens may be formed directly over the substrate or the light-receiving element, or a lens array formed separately, such as a microlens array, may be attached to the substrate.

Structure Example 2-3

Figure 16C:
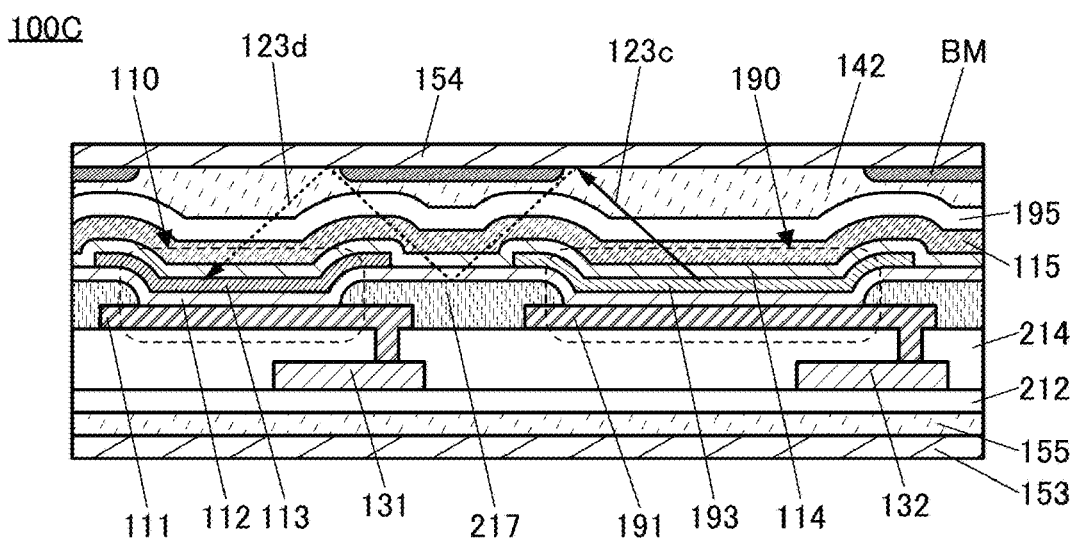

FIG. 16C is a schematic cross-sectional view of a display panel 100C. The display panel 100C differs from the display panel 100A in that the substrate 151, the substrate 152, and the partition 216 are not included and a substrate 153, a substrate 154, an adhesive layer 155, an insulating layer 212, and a partition 217 are included.

The substrate 153 and the insulating layer 212 are attached to each other with the adhesive layer 155. The substrate 154 and the protective layer 195 are attached to each other with the adhesive layer 142.

The display panel 100C is formed in such a manner that the insulating layer 212, the transistor 131, the transistor 132, the light-receiving element 110, the light-emitting element 190, and the like that are formed over a formation substrate are transferred onto the substrate 153. The substrate 153 and the substrate 154 are preferably flexible. Accordingly, the display panel 100C can be highly flexible. For example, a resin is preferably used for each of the substrate 153 and the substrate 154.

For each of the substrate 153 and the substrate 154, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 153 and the substrate 154.

For the substrate included in the display panel of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

The partition 217 preferably absorbs light emitted from the light-emitting element. As the partition 217, a black matrix can be formed using a resin material containing pigment or dye, for example. Moreover, the partition 217 can be formed of a colored insulating layer by using a brown resist material.

In the case where the partition 217 is formed using a material that transmits light emitted from the light-emitting element 190, light 123c emitted from the light-emitting element 190 might be reflected by the substrate 154 and the partition 217 and reflected light 123d might be incident on the light-receiving element 110. In other cases, the light 123c passes through the partition 217 and is reflected by a transistor, a wiring, or the like, and thus reflected light is incident on the light-receiving element 110. When the partition 217 absorbs the light 123c, the reflected light 123d can be inhibited from being incident on the light-receiving element 110. Consequently, noise can be reduced, and the sensitivity of the sensor using the light-receiving element 110 can be increased.

The partition 217 preferably absorbs at least a wavelength of light that is detected by the light-receiving element 110. For example, in the case where the light-receiving element 110 detects red light emitted from the light-emitting element 190, the partition 217 preferably absorbs at least red light. For example, when the partition 217 includes a blue color filter, the partition 217 can absorb the red light 123c and thus the reflected light 123d can be inhibited from being incident on the light-receiving element 110.

Structure Example 2-4

Although the light-emitting element and the light-receiving element include two common layers in the above example, one embodiment of the present invention is not limited thereto. Examples in which common layers have different structures are described below.

Figure 18A:
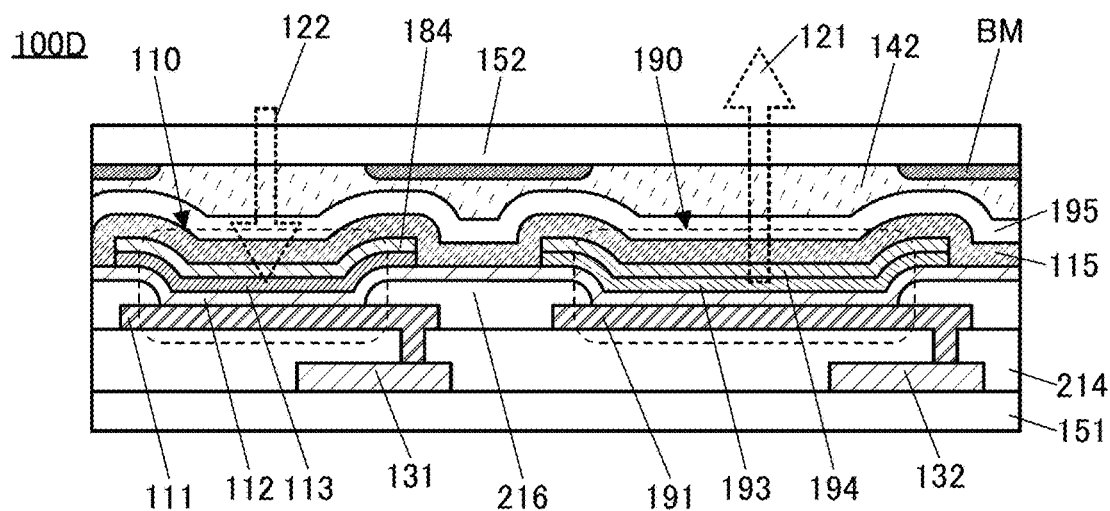
FIGS. 18A to 18C each show a structure example of a display device.

FIG. 18A is a schematic cross-sectional view of the display panel 100D. The display panel 100D differs from the display panel 100A in that the common layer 114 is not included and a buffer layer 184 and a buffer layer 194 are included. The buffer layer 184 and the buffer layer 194 may each have a single-layer structure or a stacked-layer structure.

In the display panel 100D, the light-receiving element 110 includes the pixel electrode 111, the common layer 112, the active layer 113, the buffer layer 184, and the common electrode 115. In the display panel 100D, the light-emitting element 190 includes the pixel electrode 191, the common layer 112, the light-emitting layer 193, the buffer layer 194, and the common electrode 115.

In the display panel 100D, an example is shown in which the buffer layer 184 between the common electrode 115 and the active layer 113 and the buffer layer 194 between the common electrode 115 and the light-emitting layer 193 are formed separately. As the buffer layer 184 and the buffer layer 194, one or both of an electron-injection layer and an electron-transport layer can be formed, for example.

Figure 18B:
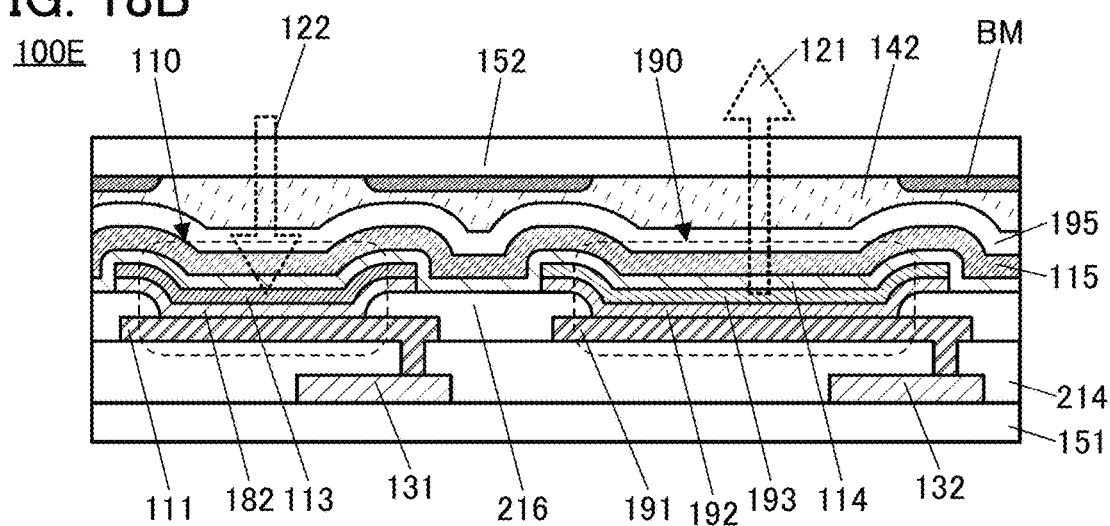

FIG. 18B is a schematic cross-sectional view of the display panel 100E. The display panel 100E differs from the display panel 100A in that the common layer 112 is not included and a buffer layer 182 and a buffer layer 192 are included. The buffer layer 182 and the buffer layer 192 may each have a single-layer structure or a stacked-layer structure.

In the display panel 100E, the light-receiving element 110 includes the pixel electrode 111, the buffer layer 182, the active layer 113, the common layer 114, and the common electrode 115. In the display panel 100E, the light-emitting element 190 includes the pixel electrode 191, the buffer layer 192, the light-emitting layer 193, the common layer 114, and the common electrode 115.

In the display panel 100E, an example is shown in which the buffer layer 182 between the pixel electrode 111 and the active layer 113 and the buffer layer 192 between the pixel electrode 191 and the light-emitting layer 193 are formed separately. As the buffer layer 182 and the buffer layer 192, one or both of a hole-injection layer and a hole-transport layer can be formed, for example.

Figure 18C:
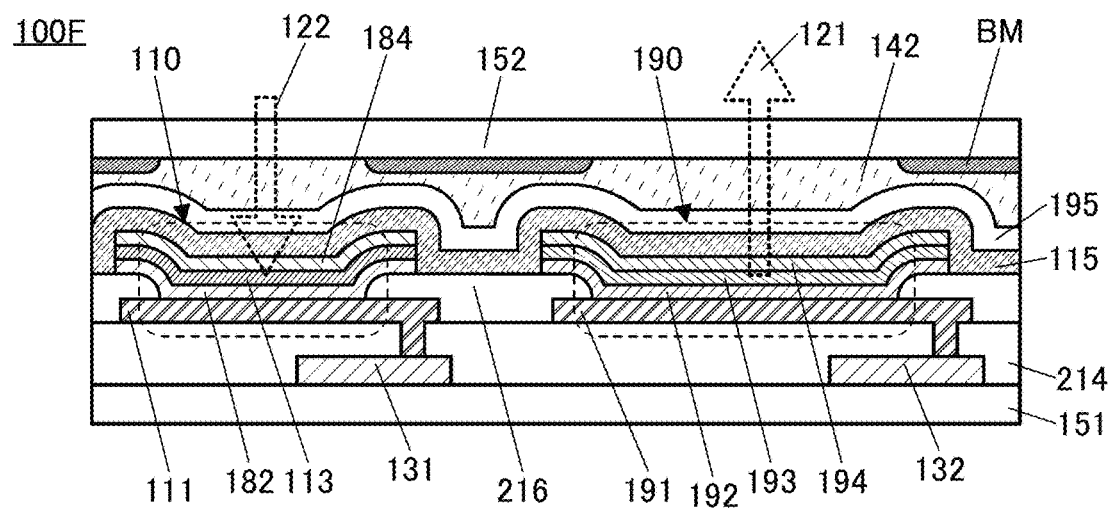

FIG. 18C is a schematic cross-sectional view of the display panel 100F. The display panel 100F differs from the display panel 100A in that the common layers 112 and 114 are not included and the buffer layers 182, 184, 192, and 194 are included.

In the display panel 100F, the light-receiving element 110 includes the pixel electrode 111, the buffer layer 182, the active layer 113, the buffer layer 184, and the common electrode 115. In the display panel 100F, the light-emitting element 190 includes the pixel electrode 191, the buffer layer 192, the light-emitting layer 193, the buffer layer 194, and the common electrode 115.

Another layer as well as the active layer 113 and the light-emitting layer 193 can be formed separately when the light-receiving element 110 and the light-emitting element 190 are manufactured.

In the example of the display panel 100F, in each of the light-receiving element 110 and the light-emitting element 190, a common layer is not provided between the pair of electrodes (the pixel electrode 111 or 191 and the common electrode 115). The light-receiving element 110 and the light-emitting element 190 included in the display panel 100F can be manufactured in the following manner: the pixel electrode 111 and the pixel electrode 191 are formed over the insulating layer 214 using the same material in the same step; the buffer layer 182, the active layer 113, and the buffer layer 184 are formed over the pixel electrode 111; the buffer layer 192, the light-emitting layer 193, and the buffer layer 194 are formed over the pixel electrode 191; and then, the common electrode 115 is formed to cover the buffer layer 184, the buffer layer 194, and the like.

Note that the manufacturing order of the stacked-layer structure of the buffer layer 182, the active layer 113, and the buffer layer 184 and the stacked-layer structure of the buffer layer 192, the light-emitting layer 193, and the buffer layer 194 is not particularly limited. For example, after the buffer layer 182, the active layer 113, and the buffer layer 184 are deposited, the buffer layer 192, the light-emitting layer 193, and the buffer layer 194 may be deposited. In contrast, the buffer layer 192, the light-emitting layer 193, and the buffer layer 194 may be deposited before the buffer layer 182, the active layer 113, and the buffer layer 184 are deposited. Alternatively, the buffer layer 182, the buffer layer 192, the active layer 113, and the light-emitting layer 193 may be deposited in that order, for example.

Structure Example 3 of Display Panel

More specific structure examples of the display panel are described below.

Structure Example 3-1

Figure 19:
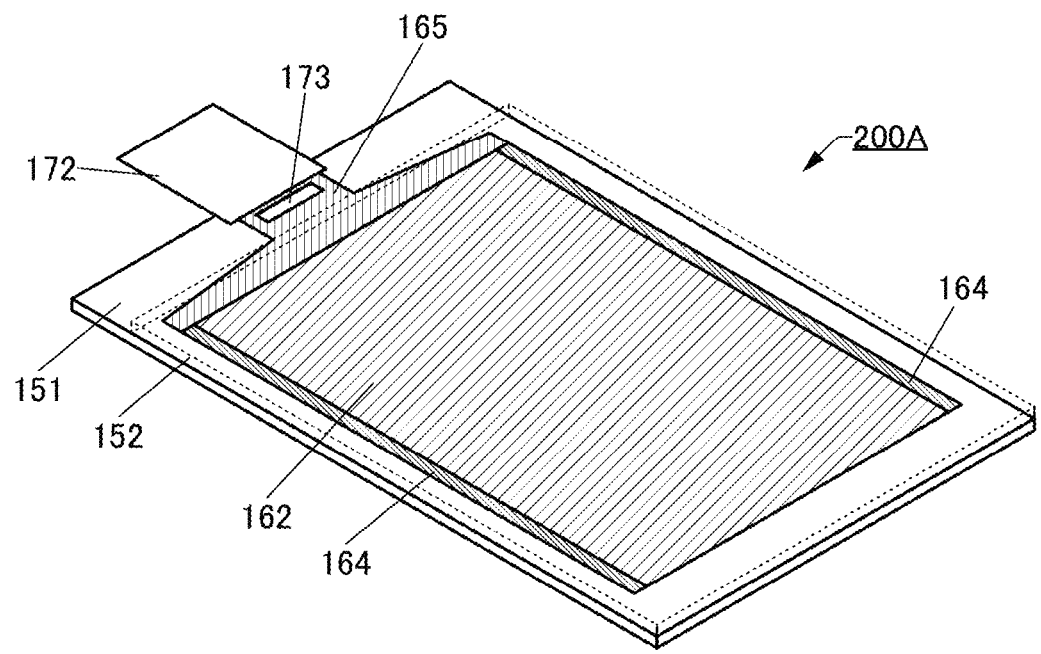
FIG. 19 shows a structure example of a display device.

FIG. 19 is a perspective view of a display panel 200A.

In the display panel 200A, the substrate 151 and the substrate 152 are attached to each other. In FIG. 19, the substrate 152 is indicated by a dashed-dotted line.

The display panel 200A includes a display portion 162, circuits 164, a wiring 165, and the like. FIG. 19 shows an example in which an integrated circuit (IC) 173 and an FPC 172 are mounted on the display panel 200A. Thus, the structure shown in FIG. 19 can be regarded as a display module including the display panel 200A, the IC, and the FPC.

As the circuits 164, scan line driver circuits can be used.

The wiring 165 has a function of supplying a signal and power to the display portion 162 and the circuits 164. The signal and power are input to the wiring 165 from the outside through the FPC 172 or from the IC 173.

FIG. 19 shows an example in which the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display panel 200A and the display module are not necessarily provided with an IC. The IC may be mounted on the FPC by a COF method or the like.

Figure 20:
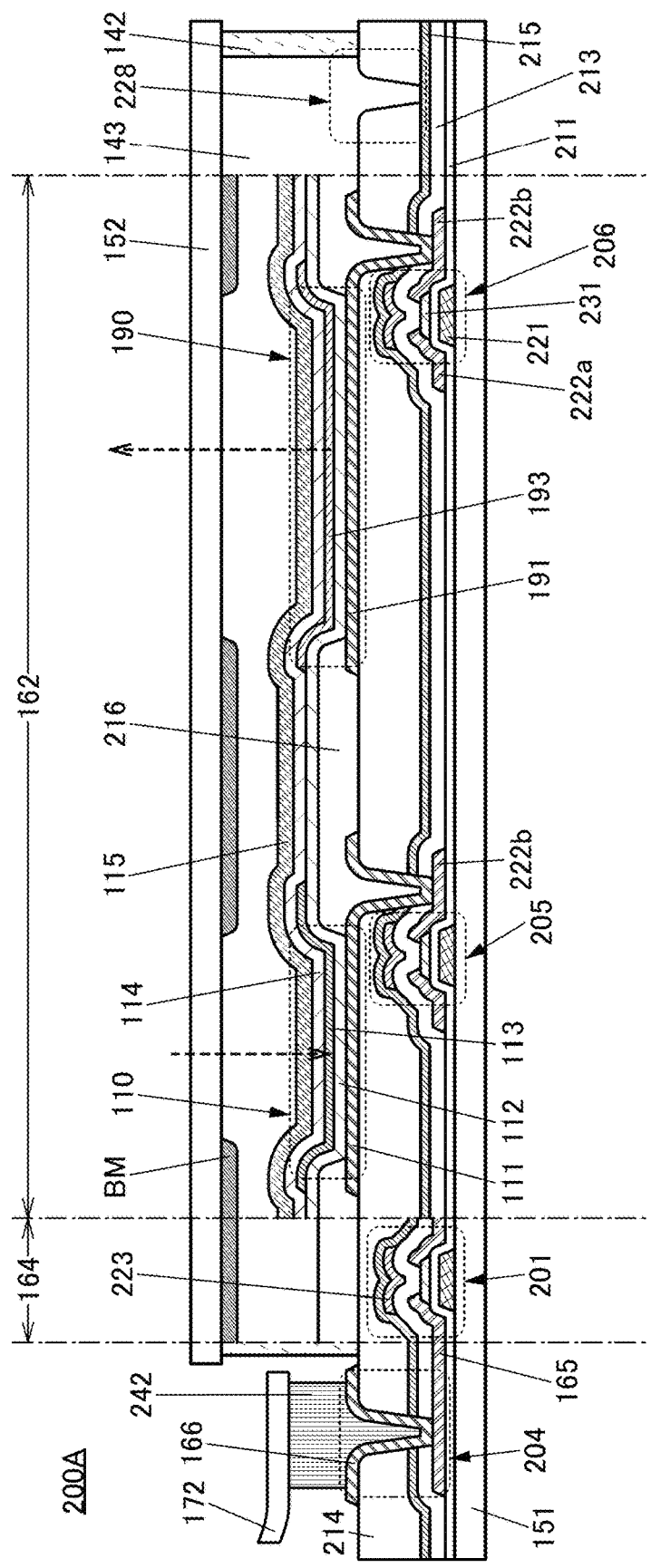
FIG. 20 shows a structure example of a display device.

FIG. 20 shows an example of cross sections of part of a region including the FPC 172, part of a region including the circuit 164, part of a region including the display portion 162, and part of a region including an end portion of the display panel 200A shown in FIG. 19.

The display panel 200A shown in FIG. 20 includes a transistor 201, a transistor 205, a transistor 206, the light-emitting element 190, the light-receiving element 110, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting element 190 and the light-receiving element 110. In FIG. 20, a hollow sealing structure is employed in which a space 143 surrounded by the substrate 152, the adhesive layer 142, and the insulating layer 214 is filled with an inert gas (e.g., nitrogen or argon). The adhesive layer 142 may overlap with the light-emitting element 190. The space 143 surrounded by the substrate 152, the adhesive layer 142, and the insulating layer 214 may be filled with a resin different from that of the adhesive layer 142.

The light-emitting element 190 has a stacked-layer structure in which the pixel electrode 191, the common layer 112, the light-emitting layer 193, the common layer 114, and the common electrode 115 are stacked in that order from the insulating layer 214 side. The pixel electrode 191 is connected to a conductive layer 222b included in the transistor 206 through an opening provided in the insulating layer 214.

The transistor 206 has a function of controlling the driving of the light-emitting element 190. The end portion of the pixel electrode 191 is covered with the partition 216. The pixel electrode 191 contains a material that reflects visible light, and the common electrode 115 contains a material that transmits visible light.

The light-receiving element 110 has a stacked-layer structure in which the pixel electrode 111, the common layer 112, the active layer 113, the common layer 114, and the common electrode 115 are stacked in that order from the insulating layer 214 side. The pixel electrode 111 is electrically connected to the conductive layer 222b included in the transistor 205 through an opening provided in the insulating layer 214. The end portion of the pixel electrode 111 is covered with the partition 216. The pixel electrode 111 contains a material that reflects visible light, and the common electrode 115 contains a material that transmits visible light.

Light from the light-emitting element 190 is emitted toward the substrate 152. Light is incident on the light-receiving element 110 through the substrate 152 and the space 143. For the substrate 152, a material having a high visible-light-transmitting property is preferably used.

The pixel electrode 111 and the pixel electrode 191 can be formed using the same material in the same step. The common layer 112, the common layer 114, and the common electrode 115 are used in both the light-receiving element 110 and the light-emitting element 190. The light-receiving element 110 and the light-emitting element 190 can have common components except the active layer 113 and the light-emitting layer 193. Thus, the light-receiving element 110 can be incorporated in the display panel 200A without a significant increase in the number of manufacturing steps.

The light-blocking layer BM is provided on the surface of the substrate 152 on the substrate 151 side. The light-blocking layer BM has the opening at the position overlapping with the light-receiving element 110 and the opening at the position overlapping with the light-emitting element 190. Providing the light-blocking layer BM can control the range where the light-receiving element 110 detects light. Furthermore, providing the light-blocking layer BM can inhibit light from being directly incident on the light-receiving element 110 from the light-emitting element 190. Accordingly, a sensor with less noise and high sensitivity can be obtained.

The transistor 201, the transistor 205, and the transistor 206 are formed over the substrate 151. These transistors can be formed using the same material in the same step.

An insulating layer 211, an insulating layer 213, an insulating layer 215, and the insulating layer 214 are provided in that order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display device.

An inorganic insulating film is preferably used for each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Alternatively, a stack including two or more of the above insulating films may be used.

Here, an organic insulating film often has a lower barrier property than an inorganic insulating film. Therefore, the organic insulating film preferably has an opening in the vicinity of an end portion of the display panel 200A. This can inhibit entry of impurities from the end portion of the display panel 200A through the organic insulating film. Alternatively, the organic insulating film may be formed so that its end portion is positioned on the inner side compared to the end portion of the display panel 200A, to prevent the organic insulating film from being exposed at the end portion of the display panel 200A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 shown in FIG. 20, an opening is formed in the insulating layer 214. This can inhibit entry of impurities into the display portion 162 from the outside through the insulating layer 214 even when an organic insulating film is used as the insulating layer 214. Consequently, the reliability of the display panel 200A can be increased.

The transistors 201, 205, and 206 each include a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display panel of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The transistors 201, 205, and 206 each have a structure in which the semiconductor layer where a channel is formed is positioned between two gates. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

The semiconductor layer of the transistor preferably contains a metal oxide (also referred to as an oxide semiconductor). Alternatively, the semiconductor layer of the transistor may contain silicon. Examples of silicon include amorphous silicon and crystalline silicon (e.g., low-temperature polysilicon and single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, the atomic ratio of In to M of a sputtering target used for depositing the In-M-Zn oxide is preferably 1 or more. The atomic ratio of metal elements in such a sputtering target is, for example, In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, or In:M:Zn=5:2:5.

A target containing a polycrystalline oxide is preferably used as the sputtering target, which facilitates formation of a semiconductor layer having crystallinity. Note that the atomic ratio in the semiconductor layer to be deposited varies within the range of ±40% from any of the atomic ratios of the metal elements contained in the sputtering target. For example, in the case where the composition of a sputtering target used for the semiconductor layer is In:Ga:Zn=4:2:4.1 [atomic ratio], the composition of the semiconductor layer to be deposited is in the neighborhood of In:Ga:Zn=4:2:3 [atomic ratio] in some cases.

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 where the substrate 152 does not overlap. In the connection portion 204, the wiring 165 is electrically connected to the FPC 172 through a conductive layer 166 and a connection layer 242. On a top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on an outer surface of the substrate 152. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water-repellent film suppressing the attachment of stain, a hard coat film inhibiting generation of a scratch caused by the use, an impact-absorbing layer, or the like may be provided on the outer surface of the substrate 152.

For each of the substrates 151 and 152, glass, quartz, ceramic, sapphire, a resin, or the like can be used. When each of the substrates 151 and 152 is formed using a flexible material, the flexibility of the display panel can be increased.

As the adhesive layer 142, the adhesive layer 155, and the like, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

The light-emitting element 190 may be a top emission, bottom emission, or dual emission light-emitting element, or the like. A conductive film that transmits visible light is used as the electrode through which light is extracted. A conductive film that reflects visible light is preferably used as the electrode through which light is not extracted.

The light-emitting element 190 includes at least the light-emitting layer 193. In addition to the light-emitting layer 193, the light-emitting element 190 may further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. For example, the common layer 112 preferably includes one or both of a hole-injection layer and a hole-transport layer. For example, the common layer 114 preferably includes one or both of an electron-transport layer and an electron-injection layer.

Either a low-molecular compound or a high-molecular compound can be used for the common layer 112, the light-emitting layer 193, and the common layer 114, and an inorganic compound may also be contained. The layers included in the common layer 112, the light-emitting layer 193, and the common layer 114 can be formed by any of the following methods, for example: an evaporation method (including a vacuum evaporation method), a transfer method, a printing method, an inkjet method, and a coating method.

The light-emitting layer 193 may contain an inorganic compound such as quantum dots.

The active layer 113 of the light-receiving element 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting element 190 and the active layer 113 of the light-receiving element 110 can be formed by the same method (e.g., a vacuum evaporation method) and thus the same manufacturing apparatus can be used.

Examples of an n-type semiconductor material contained in the active layer 113 include electron-accepting organic semiconductor materials such as fullerene (e.g., $C_{60}$ and $C_{70}$) and fullerene derivatives. Fullerene has a soccer ball-like shape, which is energetically stable. HOMO and LUMO levels of fullerene are deep (low). Since the LUMO level of fullerene is deep, fullerene has an extremely high electron-accepting property (acceptor property). In general, when π-electron conjugation (resonance) spreads on a plane like benzene, an electron-donating property (donor property) becomes high. However, since fullerene has a spherical shape, fullerene has a high electron-accepting property even when a π-electron widely spreads. The high electron-accepting property is advantageous to a light-receiving device because charge separation can be efficiently performed at high speed. In addition, $C_{60}$ and $C_{70}$ each have a wide absorption band in a visible light region, and it is particularly preferable to use $C_{70}$ because $C_{70}$ has a wider π-electron conjugated system than $C_{60}$ and a wide absorption band also in a long wavelength region.

Other examples of the n-type semiconductor material contained in the active layer 113 include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 113 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

For example, the active layer 113 is preferably formed by co-evaporation of an n-type semiconductor and a p-type semiconductor. Alternatively, the active layer 113 may be formed by stacking an n-type semiconductor and a p-type semiconductor.

As materials of a gate, a source, and a drain of a transistor, and conductive layers functioning as wirings and electrodes included in the display panel, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. These materials can also be used for conductive layers such as wirings and electrodes included in the display panel, and conductive layers (e.g., a conductive layer functioning as a pixel electrode or a common electrode) included in a display element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

Structure Example 3-2

FIG. 21A is a cross-sectional view of a display panel 200B. The display panel 200B differs from the display panel 200A mainly in that the lens 149 and the protective layer 195 are provided.

Providing the protective layer 195 covering the light-receiving element 110 and the light-emitting element 190 can inhibit diffusion of impurities such as water into the light-receiving element 110 and the light-emitting element 190, so that the reliability of the light-receiving element 110 and the light-emitting element 190 can be increased.

In the region 228 in the vicinity of an end portion of the display panel 200B, the insulating layer 215 and the protective layer 195 are preferably in contact with each other through an opening in the insulating layer 214. In particular, the inorganic insulating film included in the insulating layer 215 and an inorganic insulating film included in the protective layer 195 are preferably in contact with each other. Thus, diffusion of impurities from the outside into the display portion 162 through an organic insulating film can be inhibited. Accordingly, the reliability of the display panel 200B can be increased.

FIG. 21B shows an example in which the protective layer 195 has a three-layer structure. In FIG. 21B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 195, so that the reliability of the light-receiving element 110 and the light-emitting element 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 149 is provided on the surface of the substrate 152 on the substrate 151 side. The lens 149 has the convex surface on the substrate 151 side. It is preferable that the light-receiving region of the light-receiving element 110 overlap with the lens 149 and do not overlap with the light-emitting layer 193. Thus, the sensitivity and accuracy of the sensor using the light-receiving element 110 can be increased.

The lens 149 preferably has a refractive index of higher than or equal to 1.3 and lower than or equal to 2.5 with respect to the wavelength of light received by the light-receiving element 110. The lens 149 can be formed using at least one of an inorganic material and an organic material. For example, a material containing a resin can be used for the lens 149. Moreover, a material containing at least one of an oxide and a sulfide can be used for the lens 149.

Specifically, a resin containing chlorine, bromine, or iodine, a resin containing a heavy metal atom, a resin having an aromatic ring, a resin containing sulfur, or the like can be used for the lens 149. Alternatively, a material containing a resin and nanoparticles of a material having a higher refractive index than the resin can be used for the lens 149. Titanium oxide, zirconium oxide, or the like can be used for the nanoparticles.

Alternatively, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, or the like can be used for the lens 149. Alternatively, zinc sulfide or the like can be used for the lens 149.

In the display panel 200B, the protective layer 195 and the substrate 152 are attached to each other with the adhesive layer 142. The adhesive layer 142 is provided to overlap with the light-receiving element 110 and the light-emitting element 190, and the display panel 200B has a solid sealing structure.

Structure Example 3-3

FIG. 22A is a cross-sectional view of a display panel 200C. The display panel 200C differs from the display panel 200B mainly in the transistor structure and including neither the light-blocking layer BM nor the lens 149.

The display panel 200C includes a transistor 208, a transistor 209, and a transistor 210 over the substrate 151.

The transistors 208, 209, and 210 each include the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the low-resistance regions 231n through openings provided in the insulating layer 225 and the insulating layer 215. One of the conductive layer 222a and the conductive layer 222b functions as a source, and the other of the conductive layer 222a and the conductive layer 222b functions as a drain.

The pixel electrode 191 of the light-emitting element 190 is electrically connected to one of the pair of low-resistance regions 231n of the transistor 208 through the conductive layer 222b.

The pixel electrode 111 of the light-receiving element 110 is electrically connected to the other of the pair of low-resistance regions 231n of the transistor 209 through the conductive layer 222b.

FIG. 22A shows an example in which the insulating layer 225 covers a top surface and a side surface of the semiconductor layer. FIG. 22B shows an example in which the insulating layer 225 overlaps with the channel formation region 231i of the semiconductor layer 231 and does not overlap with the low-resistance regions 231n. The structure shown in FIG. 22B can be obtained by processing the insulating layer 225 using the conductive layer 223 as a mask, for example. In FIG. 22B, the insulating layer 215 is provided to cover the insulating layer 225 and the conductive layer 223, and the conductive layer 222a and the conductive layer 222b are connected to the low-resistance regions 231n through openings in the insulating layer 215. Furthermore, an insulating layer 218 covering the transistor may be provided.

Structure Example 3-4

Figure 23:
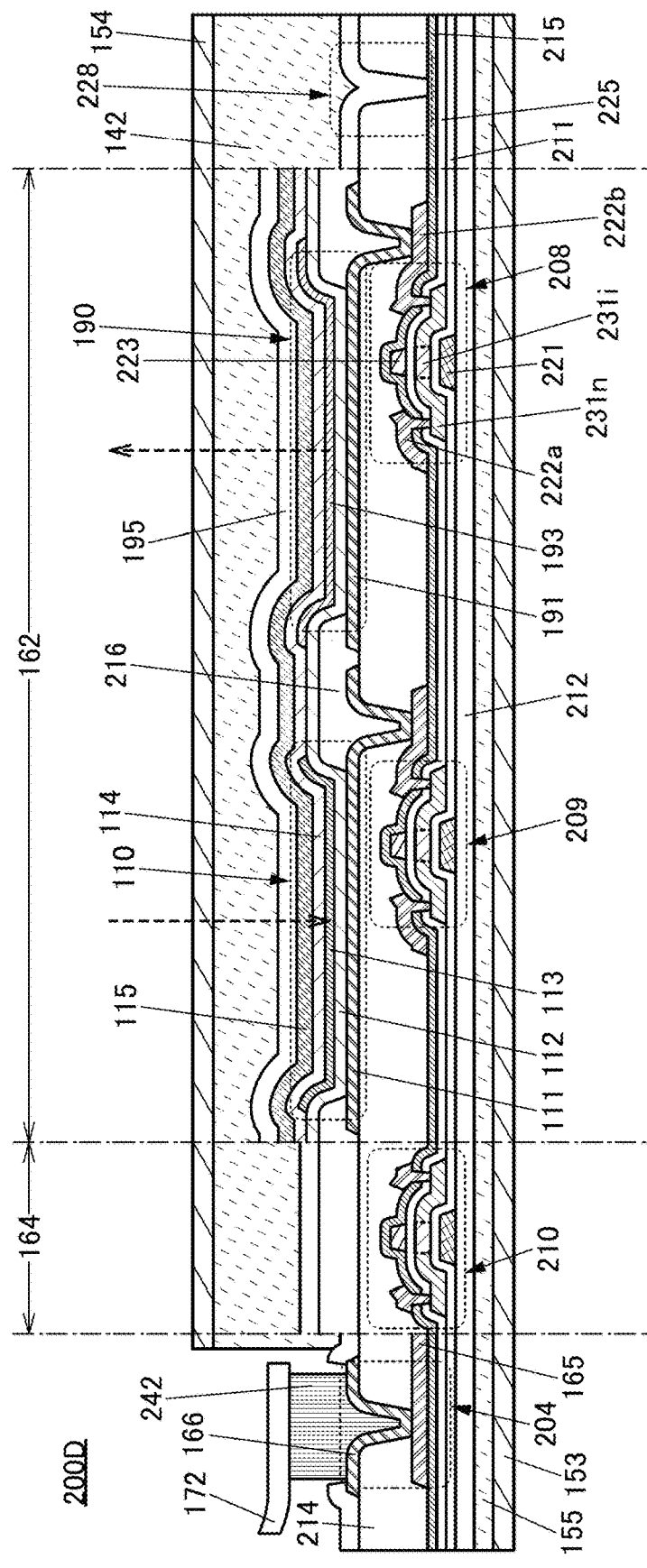
FIG. 23 shows a structure example of a display device.

FIG. 23 is a cross-sectional view of a display panel 200D. The display panel 200D differs from the display panel 200C mainly in the substrate structure.

The display panel 200D includes neither the substrate 151 nor the substrate 152 and includes the substrate 153, the substrate 154, the adhesive layer 155, and the insulating layer 212.

The substrate 153 and the insulating layer 212 are attached to each other with the adhesive layer 155. The substrate 154 and the protective layer 195 are attached to each other with the adhesive layer 142.

The display panel 200D is formed in such a manner that the insulating layer 212, the transistor 208, the transistor 209, the light-receiving element 110, the light-emitting element 190, and the like that are formed over a formation substrate are transferred onto the substrate 153. The substrate 153 and the substrate 154 are preferably flexible. Accordingly, the display panel 200D can be highly flexible.

The inorganic insulating film that can be used for the insulating layer 211, the insulating layer 213, and the insulating layer 215 can be used for the insulating layer 212. Alternatively, a stacked film of an organic insulating film and an inorganic insulating film may be used for the insulating layer 212. In that case, a film on the transistor 209 side is preferably an inorganic insulating film.

The above is the description of the structure examples of the display panel.

[Metal Oxide]

A metal oxide that can be used for the semiconductor layer is described below.

Note that in this specification and the like, a metal oxide containing nitrogen is also referred to as a metal oxide in some cases. In addition, a metal oxide containing nitrogen may be referred to as a metal oxynitride. For example, a metal oxide containing nitrogen, such as zinc oxynitride (ZnON), may be used for the semiconductor layer.

Note that the terms "CAAC (c-axis aligned crystal)" and "CAC (cloud-aligned composite)" might appear in this specification and the like. CAAC refers to an example of a crystal structure, and CAC refers to an example of a function or a material composition.

For example, a cloud-aligned composite oxide semiconductor (CAC-OS) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a semiconductor layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above conducting function, and the insulating regions have the above insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow through the component having a narrow gap. Furthermore, the component having a narrow gap complements the component having a wide gap, and carriers also flow through the component having a wide gap in conjunction with the component having a narrow gap. Therefore, in the case where the CAC-OS or the CAC-metal oxide is used for the channel formation region of the transistor, high current drive capability in an on state of the transistor, that is, high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of lattice arrangement changes between a region with regular lattice arrangement and another region with regular lattice arrangement in a region where the plurality of nanocrystals are connected.

The nanocrystal is basically a hexagon but is not always a regular hexagon and is a non-regular hexagon in some cases. Furthermore, pentagonal lattice arrangement, heptagonal lattice arrangement, and the like are included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of lattice arrangement. This is because the CAAC-OS can tolerate distortion owing to the low density of oxygen atom arrangement in the a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. Meanwhile, in the CAAC-OS, it can be said that a reduction in electron mobility due to the crystal grain boundary is less likely to occur because it is difficult to observe a clear crystal grain boundary. Furthermore, the mixing of impurities, formation of defects, or the like might decrease the crystallinity of the metal oxide; thus, it can also be said that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases when formed of the nanocrystals. In particular, IGZO crystals tend not to grow in the air and thus, a stable structure is obtained in some cases when IGZO is formed of smaller crystals (e.g., the nanocrystals) rather than larger crystals (here, crystals with a size of several millimeters or several centimeters).

The a-like OS is a metal oxide that has a structure between those of the nc-OS and the amorphous oxide semiconductor. The a-like OS includes a void or a low-density region. That is, the a-like OS has lower crystallinity than the nc-OS and the CAAC-OS.

An oxide semiconductor (a metal oxide) has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of deposition of the metal oxide film. However, to obtain a transistor having high field-effect mobility, the flow rate ratio of oxygen (the partial pressure of oxygen) at the time of deposition of the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably greater than or equal to 2 eV, further preferably greater than or equal to 2.5 eV, still further preferably greater than or equal to 3 eV. With the use of a metal oxide having such a wide energy gap, the off-state current of the transistor can be reduced.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, a vacuum evaporation method, or the like may be used.

The above is the description of the metal oxide.

At least part of this embodiment can be implemented in combination with any of the other embodiments described in this specification as appropriate.

Embodiment 3

In this embodiment, electronic devices that are examples of one embodiment of the present invention will be described with reference to FIGS. 24A to 26F.

Electronic devices of this embodiment each include the display device according to one embodiment of the present invention. The display device has a function of detecting light, and thus can perform biological authentication with a display portion or detect touch or near touch on the display portion. An electronic device according to one embodiment of the present invention is an electronic device that is difficult to abuse and has extremely high security. In addition, the electronic device can increase its functionality and convenience, for example.

Examples of electronic devices include a digital camera, a digital video camera, a digital photo frame, a cellular phone, a portable game machine, a portable information terminal, and an audio reproducing device in addition to electronic devices provided with comparatively large screens, such as a television device, a desktop or laptop personal computer, a monitor for a computer or the like, digital signage, and a large game machine like a pachinko machine.

The electronic devices of this embodiment may each include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic devices of this embodiment can each have a variety of functions. For example, the electronic devices of this embodiment can each have a function of displaying a variety of information (a still image, a moving image, a text image, and the like) on the display portion, a touch panel function, a function of displaying a calendar, date, time, and the like, a function of executing a variety of software (programs), a wireless communication function, a function of reading a program or data stored in a recording medium, and the like.

Figure 24A:
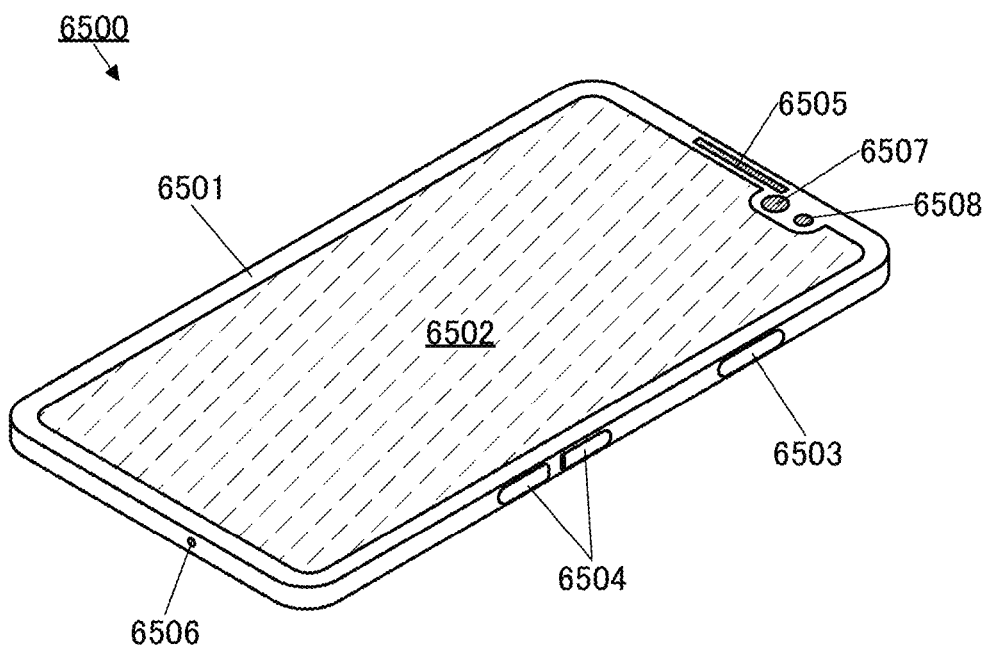
FIGS. 24A and 24B each show a structure example of an electronic device.

An electronic device 6500 shown in FIG. 24A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device according to one embodiment of the present invention can be used in the display portion 6502.

Figure 24B:
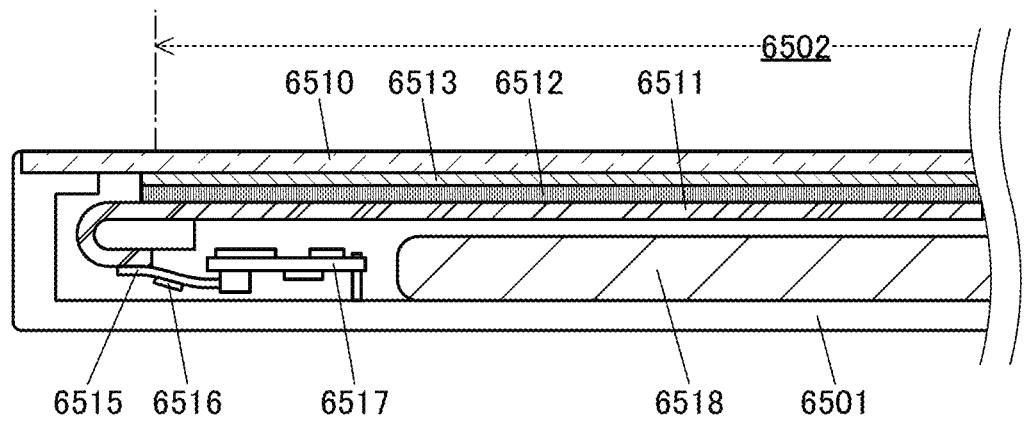

FIG. 24B is a schematic cross-sectional view including an end portion of the housing 6501 on the microphone 6506 side.

A protective component 6510 having a light-transmitting property is provided on the display surface side of the housing 6501. A display panel 6511, an optical component 6512, a touch sensor panel 6513, a printed circuit board 6517, a battery 6518, and the like are provided in a space surrounded by the housing 6501 and the protective component 6510.

The display panel 6511, the optical component 6512, and the touch sensor panel 6513 are fixed to the protective component 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display according to one embodiment of the present invention can be used for the display panel 6511. Thus, an extremely lightweight electronic device can be provided. The display panel 6511 is extremely thin, so that the battery 6518 with high capacity can be mounted while maintaining the small thickness of the electronic device. An electronic device with a narrow frame can be obtained when part of the display panel 6511 is folded back so that the portion connected to the FPC 6515 is positioned on the rear side of a pixel portion.

Figure 25A:
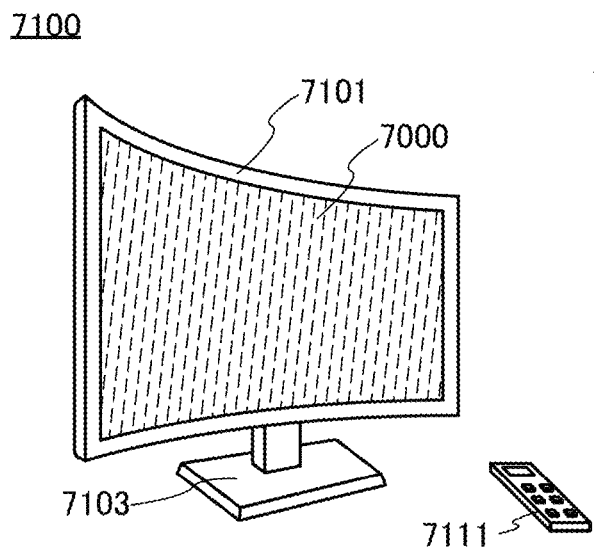
FIGS. 25A to 25D show structure examples of electronic devices.

FIG. 25A shows an example of a television device. In a television device 7100, a display portion 7000 is incorporated in a housing 7101. Here, a structure in which the housing 7101 is supported by a stand 7103 is shown.

The display device according to one embodiment of the present invention can be used in the display portion 7000.

Operation of the television device 7100 shown in FIG. 25A can be performed with an operation switch provided in the housing 7101 or a separate remote control 7111. Alternatively, the display portion 7000 may include a touch sensor, and the television device 7100 may be operated by touch on the display portion 7000 with a finger or the like. The remote control 7111 may be provided with a display portion for displaying information output from the remote control 7111. With operation keys or a touch panel provided in the remote control 7111, channels and volume can be operated and videos displayed on the display portion 7000 can be operated.

Note that the television device 7100 has a structure in which a receiver, a modem, and the like are provided. A general television broadcast can be received with the receiver. In addition, when connected to a communication network with or without wires via the modem, one-way (from a transmitter to a receiver) or two-way (between a transmitter and a receiver or between receivers) information communication can also be performed.

Figure 25B:
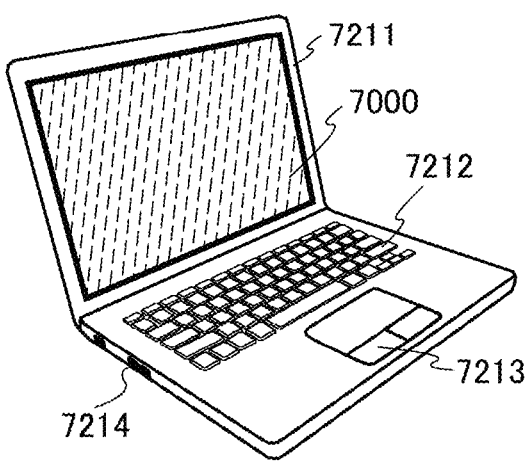

FIG. 25B shows an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device according to one embodiment of the present invention can be used in the display portion 7000.

Figure 25C:
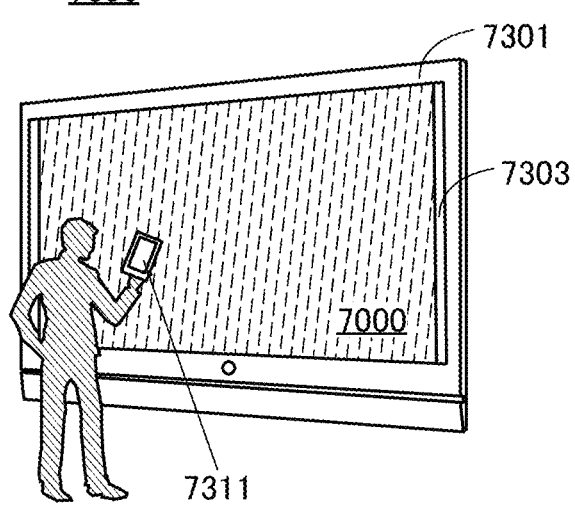
Figure 25D:
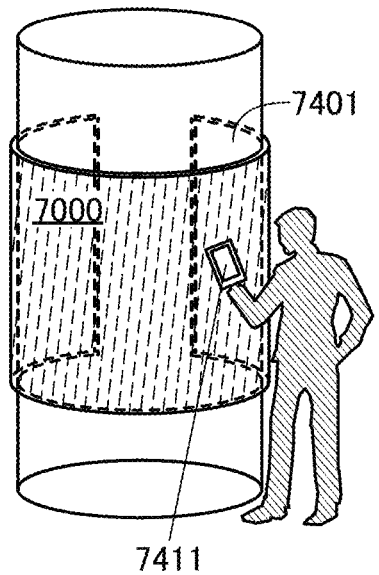

FIGS. 25C and 25D show examples of digital signage.

Digital signage 7300 shown in FIG. 25C includes a housing 7301, the display portion 7000, a speaker 7303, and the like. Furthermore, the digital signage 7300 can include an LED lamp, an operation key (including a power switch or an operation switch), a connection terminal, a variety of sensors, a microphone, and the like.

FIG. 25D is digital signage 7400 attached to a cylindrical pillar 7401. The digital signage 7400 includes the display portion 7000 provided along a curved surface of the pillar 7401.

The display device according to one embodiment of the present invention can be used in the display portion 7000 in FIGS. 25C and 25D.

The larger display portion 7000 can increase the amount of information that can be provided at a time. In addition, the larger display portion 7000 attracts more attention, so that the effect of advertising can be increased, for example.

It is preferable to use a touch panel in the display portion 7000 because in addition to display of a still image or a moving image on the display portion 7000, intuitive operation by a user is possible. Moreover, for an application for providing information such as route information or traffic information, usability can be enhanced by intuitive operation.

Furthermore, as shown in FIGS. 25C and 25D, it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the information terminal 7311 or the information terminal 7411. Moreover, by operation of the information terminal 7311 or the information terminal 7411, a displayed image on the display portion 7000 can be switched.

Furthermore, it is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices shown in FIGS. 26A to 26F include a housing 9000, a display portion 9001, a speaker 9003, an operation key 9005 (including a power switch or an operation switch), a connection terminal 9006, a sensor 9007 (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, an odor, or infrared rays), a microphone 9008, and the like.

The electronic devices shown in FIGS. 26A to 26F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with a variety of software (programs), a wireless communication function, a function of reading out and processing a program or data stored in a recording medium, and the like. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices shown in FIGS. 26A to 26F are described below.

Figure 26A:
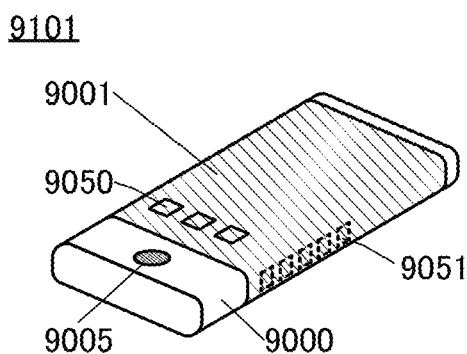
FIGS. 26A to 26F show structure examples of electronic devices.

FIG. 26A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. In addition, the portable information terminal 9101 can display characters and image information on its plurality of surfaces. FIG. 26A shows an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in a position where the information 9051 is displayed.

Figure 26B:
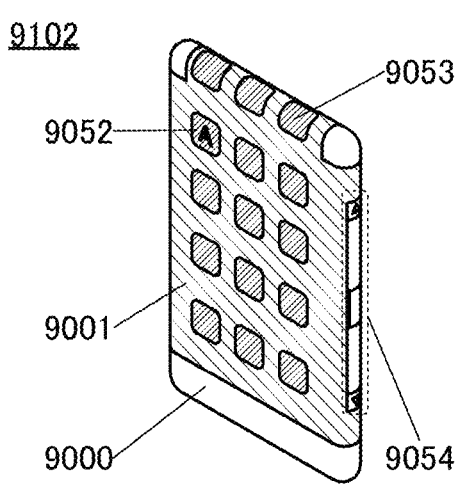

FIG. 26B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can also check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

Figure 26C:
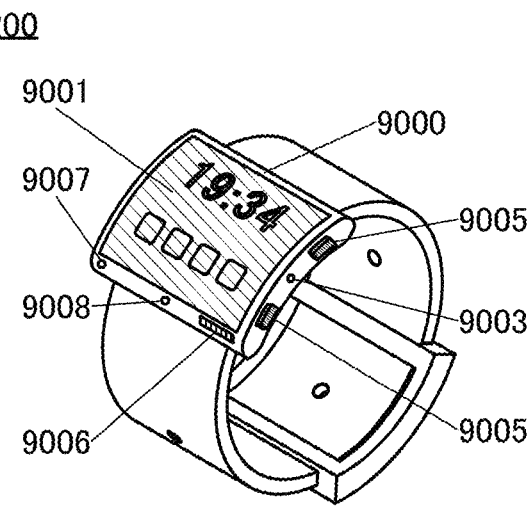

FIG. 26C is a perspective view showing a watch-type portable information terminal 9200. In addition, a display surface of the display portion 9001 is curved and provided, and display can be performed along the curved display surface. Furthermore, intercommunication between the portable information terminal 9200 and, for example, a headset capable of wireless communication enables hands-free calling. Moreover, with the connection terminal 9006, the portable information terminal 9200 can also perform mutual data transmission with another information terminal and charging. Note that charging operation may be performed by wireless power feeding.

Figure 26D:
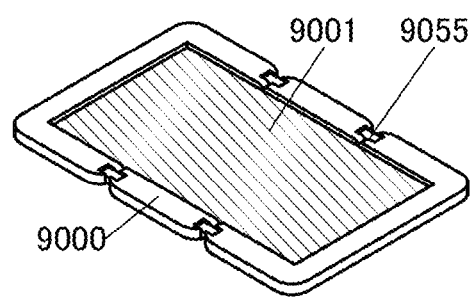
Figure 26E:
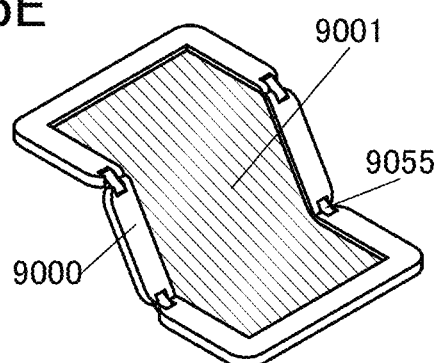
Figure 26F:
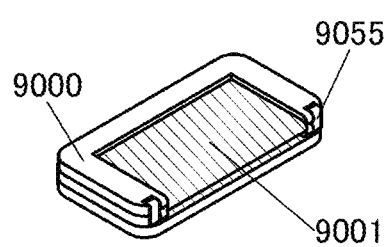

FIGS. 26D, 26E, and 26F are perspective views showing a foldable portable information terminal 9201. In addition, FIG. 26D is a perspective view of an unfolded state of the portable information terminal 9201, FIG. 26F is a perspective view of a folded state thereof, and FIG. 26E is a perspective view of a state in the middle of change from one of FIGS. 26D and 26F to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature of greater than or equal to 0.1 mm and less than or equal to 150 mm.

At least part of this embodiment can be implemented in combination with any of the other embodiments described in this specification as appropriate.

Example

In this example, a display device according to one embodiment of the present invention was manufactured and results of imaging using the display device were shown.
[Display Device]

The display device was manufactured by forming a transistor over a glass substrate and forming light-emitting elements and a light-receiving element over the transistor. Furthermore, as a protective layer for protecting the light-emitting elements and the light-receiving element, a film containing an organic resin was attached onto the light-emitting elements and the light-receiving element with an adhesive layer therebetween.

As the transistor, a top-gate transistor including an In—Ga—Zn-based oxide for a semiconductor layer where a channel is formed was used. The transistor was manufactured over the glass substrate at a process temperature lower than 500° C.

As the light-emitting elements, organic EL elements of red (R), green (G), and blue (B) were used. The light-emitting elements were top-emission light-emitting elements. An organic photodiode was used as the light-receiving element. A buffer layer and a common electrode were shared by the organic EL elements and the organic photodiode. Each of the light-emitting layers and an active layer were formed separately by a vacuum evaporation method using a metal mask.

As circuits for driving the light-emitting elements, the circuits shown in FIG. 4B and FIG. 7 were used. As a circuit for driving the light-receiving element, the circuit shown in FIG. 12 was used.

The display device includes a display portion with a screen diagonal of 7.99 inches, a pixel count of 1080×2160, a pixel size of 84 μm×84 μm, and a resolution of 302 ppi. The display device includes a gate driver for image display, a demultiplexer, a scan driver for a sensor, a read circuit, and the like, and further includes a source driver for image display, an AD converter circuit, and the like as external circuits.
[Imaging]

Imaging was performed while a palm was put on a display surface of the display device. Imaging was performed using the green light-emitting element as a light source while the green light-emitting element was emitting light. After that, obtained image data was subjected to smoothing processing for noise removal and contrast adjustment for improvement in visibility.

Figure 27A:
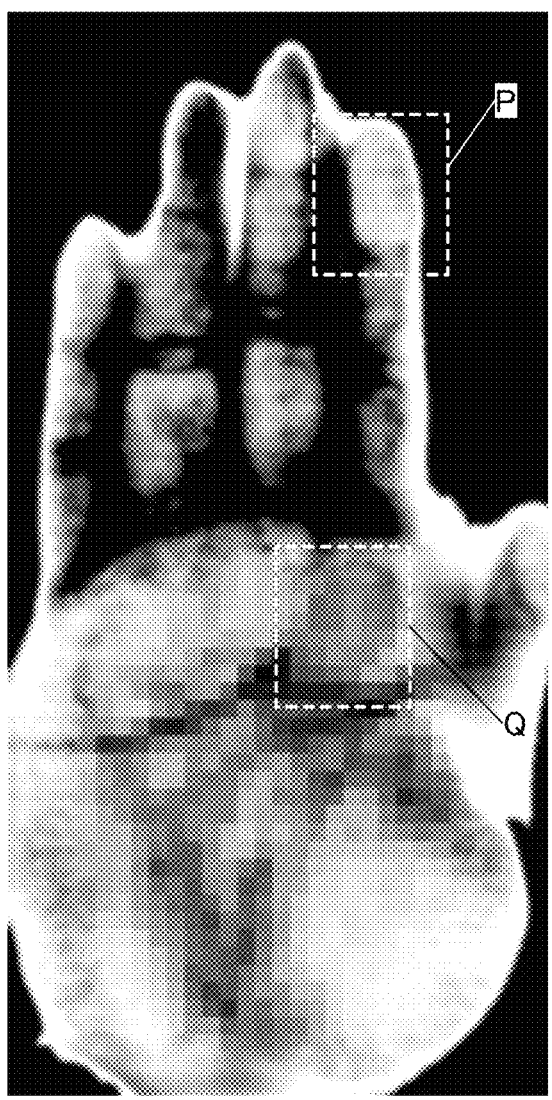
FIGS. 27A to 27C show results of imaging in Example.
Figure 27B:

FIG. 27A shows a captured image. FIG. 27B is an enlarged image of a region P shown in FIG. 27A, and FIG. 27C is an enlarged image of a region Q shown in FIG. 27A.

Figure 27C:
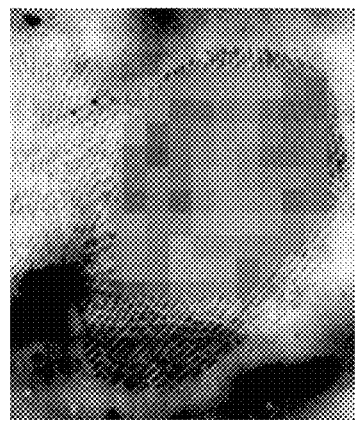

Note that in FIGS. 27A, 27B, and 27C, mosaic processing was performed on parts of the images to protect personal information.

According to one embodiment of the present invention, the size of an imaging region can be increased and the entire display region can serve as the imaging region; therefore, as shown in FIG. 27A, a clear image of the palm and a tip of each finger can be captured by one-time imaging.

According to one embodiment of the present invention, pixel density can be increased throughout the imaging region (the display region). Thus, even in the region Q that is near the center of the imaging region and in the region P that is near an end portion of the imaging region, clear images of a fingerprint and a palm print can be captured, as shown in FIGS. 27C and 27B.

As described above, it was confirmed that the display device according to one embodiment of the present invention not only can display images but also can capture clear images of objects that are in contact with the display surface. Thus, the display device is suitably used for biological authentication such as fingerprint authentication or palm print authentication. In addition, the display device can also be used as an extremely thin image scanner that does not require a separate light source.

This application is based on Japanese Patent Application Serial No. 2019-157094 filed with Japan Patent Office on Aug. 29, 2019 and Japanese Patent Application Serial No. 2020-082434 filed with Japan Patent Office on May 8, 2020, the entire contents of which are hereby incorporated by reference.

What is claimed is:

1. A display device comprising:
   a first pixel comprising a first transistor, a second transistor, a third transistor, a fourth transistor, a first capacitor, a second capacitor, and a first light-emitting element; and
   a second pixel comprising a fifth transistor, a sixth transistor, and a second light-emitting element,
   wherein one of a source and a drain of the first transistor is electrically connected to a gate of the second transistor and one electrode of the first capacitor,
   wherein one of a source and a drain of the second transistor is electrically connected to the first light-emitting element, wherein one of a source and a drain of the third transistor and one of a source and a drain of the fourth transistor are electrically connected to a first wiring, wherein the other of the source and the drain of the third transistor is electrically connected to the other electrode of the first capacitor, wherein the other of the source and the drain of the fourth transistor is electrically connected to the first light-emitting element, wherein one electrode of the second capacitor is electrically connected to the gate of the second transistor, wherein the other electrode of the second capacitor is electrically connected to the one of the source and the drain of the second transistor, wherein one of a source and a drain of the fifth transistor and one of a source and a drain of the sixth transistor are electrically connected to the first wiring, and wherein the other of the source and the drain of the sixth transistor is electrically connected to the second light-emitting element.

2. The display device according to claim 1, wherein each of the first transistor, the second transistor, the third transistor, and the fourth transistor comprises an oxide semiconductor in a channel formation region.

3. The display device according to claim 1, further comprising a third pixel,
wherein the third pixel comprises a light-receiving element.

4. The display device according to claim 1,
wherein the other of the source and the drain of the first transistor is electrically connected to a second wiring,
wherein a gate of the first transistor and a gate of the fourth transistor are electrically connected to a third wiring, and
wherein a gate of the third transistor is electrically connected to a fourth wiring.

5. The display device according to claim 1,
wherein each of the first transistor, the second transistor, the third transistor, and the fourth transistor comprises a back gate.

6. The display device according to claim 1,
wherein the first pixel and the second pixel are positioned in different columns.

7. A display device comprising:
a first pixel comprising a first transistor, a second transistor, a third transistor, a fourth transistor, a first capacitor, a second capacitor, and a first light-emitting element; and
a second pixel comprising a fifth transistor, a sixth transistor, and a second light-emitting element,
wherein one of a source and a drain of the first transistor is electrically connected to a gate of the second transistor and one electrode of the first capacitor,
wherein one of a source and a drain of the second transistor is electrically connected to the first light-emitting element,
wherein one of a source and a drain of the third transistor is electrically connected to a first wiring,
wherein the other of the source and the drain of the third transistor is electrically connected to the other electrode of the first capacitor and one of a source and a drain of the fourth transistor,
wherein the other of the source and the drain of the fourth transistor is electrically connected to the first light-emitting element,
wherein one electrode of the second capacitor is electrically connected to the gate of the second transistor,
wherein the other electrode of the second capacitor is electrically connected to the one of the source and the drain of the second transistor,
wherein one of a source and a drain of the fifth transistor is electrically connected to the first wiring,
wherein the other of the source and the drain of the fifth transistor is electrically connected to one of a source and a drain of the sixth transistor, and
wherein the other of the source and the drain of the sixth transistor is electrically connected to the second light-emitting element.

8. The display device according to claim 7,
wherein each of the first transistor, the second transistor, the third transistor, and the fourth transistor comprises an oxide semiconductor in a channel formation region.

9. The display device according to claim 7, further comprising a third pixel,
wherein the third pixel comprises a light-receiving element.

10. The display device according to claim 7,
wherein the other of the source and the drain of the first transistor is electrically connected to a second wiring,
wherein a gate of the first transistor and a gate of the fourth transistor are electrically connected to a third wiring, and
wherein a gate of the third transistor is electrically connected to a fourth wiring.

11. The display device according to claim 7,
wherein each of the first transistor, the second transistor, the third transistor, and the fourth transistor comprises a back gate.

12. The display device according to claim 7,
wherein the first pixel and the second pixel are positioned in different columns.

* * * * *